United States Patent
Hayashi

(10) Patent No.: US 6,633,364 B2
(45) Date of Patent: Oct. 14, 2003

(54) EXPOSURE APPARATUS, EXPOSURE METHOD, AND DEVICE MANUFACTURING METHOD

(75) Inventor: Yutaka Hayashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/820,932

(22) Filed: Mar. 30, 2001

(65) Prior Publication Data

US 2001/0055101 A1 Dec. 27, 2001

(30) Foreign Application Priority Data

Mar. 31, 2000 (JP) ........................................ 2000-098018
Mar. 27, 2001 (JP) ........................................ 2001-089089

(51) Int. Cl.[7] ............................................. G03B 27/42
(52) U.S. Cl. ............................. 355/53; 355/77; 355/67; 430/311; 250/492.2
(58) Field of Search .......................... 355/43, 45, 53, 355/67–69, 77; 430/311; 250/492.2

(56) References Cited

U.S. PATENT DOCUMENTS

| | | | |
|---|---|---|---|
| 5,430,303 A | * | 7/1995 | Matsumoto et al. |
| 5,559,584 A | * | 9/1996 | Miyaji et al. ................. 355/53 |
| 5,871,587 A | * | 2/1999 | Hasegawa et al. .......... 118/719 |
| 6,208,406 B1 | * | 3/2001 | Nakashima |
| 6,252,648 B1 | * | 6/2001 | Hase et al. ................... 355/53 |
| 6,259,509 B1 | * | 7/2001 | Miwa et al. |
| 6,288,769 B1 | * | 9/2001 | Akagawa et al. ............. 355/53 |
| 2002/0145711 A1 | | 10/2002 | Magome et al. ............. 355/30 |

FOREIGN PATENT DOCUMENTS

WO    WO 00/22656    4/2000

* cited by examiner

*Primary Examiner*—D Rutledge
(74) *Attorney, Agent, or Firm*—Oblon, Spivak, McClelland, Maier & Neustadt, P.C.

(57) ABSTRACT

The exposure apparatus comprises a gas supply system that supplies a low absorptive gas with a predetermined purity to the illumination system housing and the barrel of the projection optical system and collects the gas exhausted from these closed spaces and supplies the gas to the mask chamber which houses the mask stage and the substrate chamber which houses the substrate stage. The illumination system housing, the barrel of the projection optical system, the mask chamber, and the substrate chamber are respectively located on the optical path of the exposure light. Accordingly, the low absorptive gas that has circulated the illumination system housing and the barrel of the projection optical system is used as the replacement gas of the mask chamber and the substrate chamber, while sufficiently satisfying the purity of the low absorptive gas and maintaining the transmittance of the exposure light required in each chamber. Thus, the usage efficiency of the low absorptive gas can be improved, and wasteful consumption of the low absorptive gas can be suppressed.

36 Claims, 6 Drawing Sheets

EXPOSURE APPARATUS, EXPOSURE METHOD, AND DEVICE MANUFACTURING METHOD

BACKGROUND OF THE INVENTION

1. Field of the Invention

The present invention relates to an exposure apparatus, an exposure method, and a device manufacturing method. More particularly, the present invention relates to an exposure apparatus and an exposure method used to manufacture a semiconductor device and the like in a lithographic process, and a device manufacturing method using the exposure apparatus.

2. Description of the Related Art

Conventionally, in the lithographic process to manufacture a semiconductor device and the like, various exposure apparatus have been used. In recent years, exposure apparatus such as the reduction projection exposure apparatus based on the step-and-repeat method (the so-called stepper), and the scanning type projection exposure apparatus based on the step-and-scan method (the so-called scanning stepper), are becoming mainstream. The stepper reduces and transfers a mask pattern formed on a mask (also called a reticle), which is proportionally magnified 4 to 5 times, onto a substrate subject to exposure. And, the scanning stepper is an improvement of the stepper.

With these exposure apparatus, in order to cope with finer integrated circuits and achieve higher resolution, the exposure wavelength has shifted toward shorter wavelength. Recently, the exposure wavelength in practical use is 193 nm of the ArF excimer laser, however, exposure apparatus using shorter wavelength such as the $F_2$ laser beam having a wavelength of 157 nm or the $Ar_2$ laser beam having a wavelength of 126 nm are also being developed.

Light in the wavelength region called vacuum ultraviolet which wavelength belongs to the bandwidth of 200 nm to 120 nm such as the ArF excimer laser beam, the $F_2$ laser beam, or the $Ar_2$ laser beam, has low transmittance to optical glass. Therefore, the glass material that can be used is limited to fluoride crystal such as fluorite, magnesium fluoride, and lithium fluoride. In addition, vacuum ultraviolet light is greatly absorbed by gas such as oxygen, water vapor, and hydrocarbon gas (hereinafter referred to as "adsorptive gas") existing on the optical path. It is also greatly absorbed by contaminants in the case organic contaminants or water and the like adhere on the surface of the optical elements. Therefore, gas existing on the optical path needs to be replaced with a low absorptive gas, that is, inert gas such as nitrogen or helium (hereinafter referred to as "low absorptive gas"). When the gas is replaced, impurities concentration of organic contaminants, water, absorptive gas, and the like in the optical path where the exposure light passes through is lowered so as not to exceed several ppm.

The design concept of the ArF excimer laser exposure apparatus and the $F_2$ laser exposure apparatus is to exclude the absorptive gas as much as possible from the optical path from the light source to the wafer. Based on the concept, for example, there is an idea of covering the reticle stage and the wafer stage with casings as is with the optical elements making up the projection optical system, and structuring each casing as an independent room so that the gas in each room may be exchanged with a low absorptive gas with high purity, for example, such as helium.

In such a case, either idea had been employed; to supply low absorptive gas with high purity to each room, circulate the gas and then simply exhaust the gas outside (gas of which purity such as nitrogen has decreased due to the influence of impurities (such as absorptive gas or organic materials)), or to collect and store at least a part of the gas exhausted.

In addition, the idea was employed of supplying low absorptive gas with high purity to all the rooms in parallel.

With the method of exhausting outside the gas circulated in each room which purity has decreased or with the method of storing a part of the gas, as is described above, however, most of the gas was done away with without being recycled or just simply stored after being collected. Also, in the case of supplying low absorptive gas with high purity to a plurality of rooms respectively in parallel, a huge amount of gas is required.

For these reasons, the concept described above had to consume an enormous amount of expensive gas such as nitrogen gas, or helium gas, which is more costly. This increased the cost burden, and was likely to become the cause of increasing the production cost when manufacturing a semiconductor device.

Whereas, by simply reducing the amount of low absorptive gas consumed, that is, by reducing the amount of gas supplied into each room, the impurity concentration in the optical path will increase. And as a consequence, the transmittance of the exposure light will decrease, which becomes a cause of an exposure defect.

SUMMARY OF THE INVENTION

The present invention has been made in consideration of the circumstances described above, and has as its first object to provide an exposure apparatus and an exposure method capable of improving the usage of the low absorptive gas so that it is used effectively and wasteful consumption is suppressed, while maintaining the transmittance of the exposure light.

It is the second object of the present invention to provide a device manufacturing method that can improve the productivity when a device is manufactured.

According to the first aspect of this invention, there is provided an exposure apparatus that illuminates a mask with an energy beam from an energy beam source and transfers a pattern formed on the mask onto a substrate, the exposure apparatus comprising: at least one closed space which is located on an optical path of the energy beam between the energy beam source and the substrate; and a gas supply system which is connected to a first chamber being at least an arbitrary of the closed space and supplies a specific gas with a characteristic feature of having transmittance to the exposure beam to the first chamber, and supplies gas exhausted from the first chamber to the second chamber being at least an arbitrary of the closed space.

In this description, "closed space" includes the concept of closed space that is not completely in a sealed state in the strict sense of the word, other than space in a sealed state to the outside.

With this apparatus, the gas supply system supplies the specific gas which has a predetermined purity to the first chamber, and the gas exhausted from the first chamber is supplied to the second chamber. In this case, the specific gas which has circulated in the first chamber and the purity decreased to some extent due to degassing is supplied to the second chamber as the replacement gas. Therefore, for example, by supplying specific gas with high purity to the first chamber, and at least setting a chamber where the optical path of the energy beam is relatively short and is not seriously affected by the decrease in transmittance due to the absorption of the energy beam by impurities such as air in the optical path as the second chamber, the purity of the specific gas required in the first chamber and the second chamber can be sufficiently satisfied and the transmittance of the energy beam (exposure light) can be maintained. In addition, since the specific gas circulated in the first chamber is not exhausted outside and is used as the replacement gas of the second chamber, the usage efficiency of the specific gas can be improved, which leads to suppressing wasteful consumption of the specific gas (low absorptive gas).

In this case, the first chamber and the second chamber can be different chambers.

In this case, the exposure apparatus can further comprise: a movable optical member which is arranged between the energy beam source and the substrate; and a driving system which is connected to the optical member and drives the optical member, wherein a closed space formed in between a first optical element and a second optical element that are arranged in between the energy beam source and the substrate can structure the first chamber, and a closed space which houses at least a part of the optical member and the driving system can structure the second chamber. The first chamber, in this case, is formed in between the optical elements arranged along the optical path, so the main purpose of purging the interior with the specific gas is to remove the impurities as much as possible. Therefore, the purity level of the gas supplied to the first chamber needs to be high. On the other hand, the main purpose of purging the interior of the second chamber which houses the movable optical member and at least a part of the driving system with the specific gas is to exhaust the dust (particles) generated from the moving portion outside the chamber. So, the specific gas supplied to the second chamber may be a gas which purity is lower than the gas supplied to the first chamber. Accordingly, with the gas supply system supplying the specific gas to the first chamber, and also supplying the gas exhausted from the first chamber to the second chamber which houses the optical member and at least a part of the driving system, the purity of the specific gas required in each chamber can be sufficiently satisfied while maintaining the transmittance of the energy beam (exposure light) in the first and second chamber.

With the exposure apparatus in the present invention, the exposure apparatus can further comprise: an illumination optical system which is arranged in between the energy beam source and the mask and illuminates the mask with the energy beam from the energy beam source; and a projection optical system which is arranged in between the mask and the substrate and projects the energy beam via the mask on the substrate, wherein a housing which houses the illumination optical system, a mask chamber which houses a mask stage holding the mask, a barrel which houses the projection optical system, and a substrate chamber which houses a substrate stage holding the substrate can be arranged as the closed space, and at least one of the housings which house the illumination optical system and the projection optical system can structure the first chamber, and at least one of the mask chamber and the substrate chamber can structure the second chamber. In the case of replacing the gas within the illumination optical system housing, the barrel of the projection optical system, the mask chamber, and the substrate chamber respectively with the specific gas, the permissive concentration of impurities in the gas within the respective chambers, in other words, the purity level of the specific gas required in the respective chambers is not the same. That is, with the illumination optical system or the projection optical system where the optical path of the illumination light is long and many optical elements such as lenses are arranged, the interior needs to be filled with the specific gas which has an extremely high purity level to remove the impurities from the optical path. Meanwhile, with the mask chamber or the reticle chamber, the effect of impurities more or less existing on the optical path does not create a serious problem since the optical path is short. Accordingly, the gas supply system supplies the specific gas of a predetermined concentration to the first chamber, which is at least either the illumination optical system housing or the barrel of the projection optical system. And the specific gas that has circulated in the first chamber and the purity decreased to some extent due to degassing is supplied to the second chamber, which is at least either the mask chamber or the substrate chamber, as the replacement gas. Thus, the purity of the specific gas required in each chamber can be sufficiently satisfied while maintaining the transmittance of the energy beam (exposure light) in the first and second chamber.

With the exposure apparatus in the present invention, the gas supply system can further comprise a gas purity monitoring unit which monitors concentration of impurities in the gas exhausted from the first chamber and exhausts the gas outside when the concentration of the impurities exceeds a predetermined value. In such a case, the gas purity monitoring unit monitors the concentration of impurities in the gas exhausted from the first chamber, and if the concentration exceeds a predetermined value, then the gas is exhausted outside. Therefore, the purity of the gas supplied to the second chamber does not exceed a certain level.

In this case, the gas supply system can further comprise a gas purify unit that purifies the gas exhausted from the first chamber and improves purity of the specific gas in the gas exhausted. In such a case, the gas purify unit purifies the gas exhausted from the first chamber, and the purity of the specific gas in the exhausted gas is improved (can be restored close to the original purity). Also, in this case, due to the gas purity monitoring unit, the life of the gas purify unit can be extended.

In this case, the gas supply system can further comprise a gas supply route which separates the gas exhausted from the first chamber and partially supplies the gas to the gas purify unit and merges the gas having passed through the gas purify unit into remaining of the gas exhausted from the first chamber. In such a case, the gas supply route separates the gas exhausted from the first chamber, and a part of the gas is supplied to the gas purify unit. The gas which purity has increased by passing through the gas purify unit is merged with the remaining separated gas, and then the gas is supplied to the second chamber. Therefore, the purity of the specific gas supplied to the second chamber is not reduced more than necessary, and the life of the gas purify unit can be extended compared with the case when the gas exhausted from the first chamber is totally supplied to the gas purify unit.

In this case, the gas supply system can further comprise a temperature adjustment unit that has a chemical filter which removes impurities in the merged gas having passed through the gas supply route, and adjusts the gas to a predetermined temperature. In such a case, the gas which purity is increased by passing through the gas purify unit and then slightly decreased after merging with the remaining gas is supplied to the temperature adjustment unit. The impurities in the gas supplied are removed with the chemical filter, and the gas is then supplied to the second chamber after the temperature adjustment unit adjusts the temperature to a predetermined level. Accordingly, the gas supplied to the second chamber is gas which impurities are removed, the temperature adjusted, and the purity level relatively high. Therefore, the decrease in transmittance of the energy beam (exposure light) in the second chamber can be suppressed efficiently all the more.

With the exposure apparatus in the present invention, in the case the gas supply system comprises the gas purity monitoring unit and the gas purify unit, it does not necessary have to comprise the gas supply route described above. And, the gas supply system can further comprise a temperature adjustment unit that has a chemical filter which removes impurities in the gas having passed through the gas purify unit, and adjusts the gas to a predetermined temperature.

With the exposure apparatus in the present invention, the gas supply system does not have to comprise a gas purity monitoring unit, and can further comprise a gas purify unit which purifies and increases purity of the specific gas in the gas exhausted from the first chamber.

In this case, the gas supply system can further comprise a gas supply route which separates the gas exhausted from the first chamber and partially supplies the gas to the gas purify unit and merges the gas partially supplied to the gas purify unit into remaining of the gas exhausted from the first chamber.

In this case, the gas supply system can further comprise a temperature adjustment unit that has a chemical filter which removes impurities in the merged gas having passed through the gas supply route, and adjusts the gas to a predetermined temperature.

With the exposure apparatus in the present invention, in the case the apparatus does not comprise any of the gas purity monitoring unit, the gas purify unit, and the gas supply route, the gas supply system can further comprise a temperature adjustment unit that has a chemical filter which removes impurities in the gas exhausted from the first chamber, and adjusts the gas supplied to a predetermined temperature.

With the exposure apparatus in the present invention, it is preferable for the first chamber and the second chamber to be sealed chambers in a state sealed externally. In such a case, there is no need to worry about gas containing impurities concentrating from the outside. However, the first chamber and the second chamber do not necessarily have to be sealed chambers.

With the exposure apparatus in the present invention, the first chamber and the second chamber can be the same chamber.

With the exposure apparatus in the present invention, the gas supply system can be a gas circulation system which supplies the specific gas to the first chamber while maintaining purity of the specific gas within a predetermined range and replenishing shortage from exterior, collects the gas exhausted from the first chamber, and supplies the gas to the second chamber. In such a case, the gas circulation system supplies the specific gas to the first chamber located on the optical path of the energy beam between the energy beam source and the substrate, while maintaining the purity of the specific gas within a predetermined range and replenishing the shortage from the exterior. And the gas circulation system collects the gas exhausted from the first chamber and supplies it to the second chamber formed between the energy beam source and the substrate. In this case, the first chamber and the second chamber may be different chambers, or the first chamber and the second chamber may be the same chamber. Thus, most of the specific gas is re-used in the same or different closed space, and the usage efficiency of the specific gas (low absorptive gas) is improved and wasteful consumption suppressed. In addition, the gas circulation system maintains the purity of the specific gas supplied to the first chamber within a predetermined range. Therefore, the decrease in transmittance of the energy beam (exposure light) in the first chamber can be prevented.

In this case, of the first chamber and the second chamber, at least the first chamber may be the space existing in between the optical elements (such as lenses or mirrors) arranged on the optical path of the energy beam. Or, in the case the exposure apparatus further comprises: an illumination optical system which is arranged in between the energy beam source and the mask and illuminates the mask with the energy beam from the energy beam source; and a projection optical system which is arranged in between the mask and the substrate and projects the energy beam via the mask on the substrate, a housing which houses the illumination optical system, a mask chamber which houses a mask stage holding the mask, a barrel which houses the projection optical system, and a substrate chamber which houses a substrate stage holding the substrate can be arranged as the closed space, and the first chamber and the second chamber can be formed of one of the mask chamber, the substrate chamber, the housing which houses the illumination optical system, and the barrel which houses the projection optical system.

With the exposure apparatus in the present invention, the gas circulation system can comprise a gas circulation unit which supplies the specific gas to the first chamber, while replenishing shortage from the exterior and maintaining purity of the specific gas in accordance with an amount of returned gas exhausted from the second chamber.

With the exposure apparatus in the present invention, the gas circulation system can exhaust outside the gas exhausted from the first chamber without collecting the gas until concentration of impurities falls under a predetermined level, when initial gas replacement operation is performed to replace gas within the first chamber to the specific gas. In such a case, when the gas circulation system performs initial gas replacement operation to replace the gas inside the first chamber (gas containing much absorptive gas such as oxygen) to the specific gas, the gas is exhausted outside without being collected until the impurities in the gas exhausted from the first chamber falls below a predetermined concentration. So when the concentration of impurities (such as absorptive gas) is high in the gas exhausted from the first chamber, the gas circulation system exhausts the gas outside. Thus, the decrease in transmittance of the energy beam (exposure light) in the second chamber can be suppressed without the purity of the specific gas supplied to the second chamber deteriorating to the extreme.

In this case, the gas circulation system can include a judgement unit which judges that the concentration of impurities in the gas has fallen under a predetermined level by an elapse of a predetermined period of time after starting the initial gas replacement operation, when the initial gas replacement operation is performed. Or, the gas circulation system can include a judgement unit which has a concentration detection unit to detect concentration of at least one of impurities and specific gas in the gas and judges that the concentration of impurities in the gas has fallen under a predetermined level based on an output of the concentration detection unit when the initial gas replacement operation is performed.

With the exposure apparatus in the present invention, the gas circulation system can further comprise a gas purity monitoring unit which monitors concentration of impurities in the gas exhausted from the first chamber and exhausts the gas outside when the concentration of the impurities exceeds a predetermined value. In such a case, the gas purity monitoring unit monitors the concentration of impurities in the gas exhausted from the first chamber, and when the concentration of impurities exceeds a predetermined value the gas is exhausted outside. On the other hand, when the concentration of impurities is under the predetermined value, the gas is re-supplied to the second chamber. Accordingly, when the concentration of impurities of the gas exhausted from the fist chamber is low, the gas is re-used as the replacement gas of the second chamber. Thus, the usage efficiency of the specific gas (low absorptive gas) can be improved which leads to suppressing wasteful consumption of the gas. Meanwhile, in the case the concentration of impurities of the gas exhausted from the fist chamber is high, the gas is exhausted outside, so the decrease in transmittance of the energy beam (exposure light) in the second chamber can be suppressed without the purity of the specific gas supplied to the second chamber unnecessarily decreasing.

In this case, the gas circulation system can further comprise a gas purify unit that purifies the gas collected from the first chamber and improves purity of the specific gas in the gas collected. In such a case, the gas exhausted from the first chamber is collected and purified by the gas purify unit, and the purity of the specific gas in the exhausted gas can be improved (can be restored close to the original purity).

In this case, the gas circulation system can further comprise a temperature adjustment unit that has a chemical filter which removes impurities in the gas having passed through the gas purify unit and adjusts the gas to a predetermined temperature. Or, the gas circulation system can further comprise a gas supply route which separates the gas collected from the first chamber and partially supplies the gas to the gas purify unit and merges the gas partially supplied to the gas purify unit into remaining of the gas collected from the first chamber. In such a case, the gas supply route separates the gas collected from the first chamber, and partially supplies the gas to the gas purify unit. The gas which passes through the gas purify unit is purified so that the purity is increased, and then the gas is merged with the remaining gas and finally supplied to the second chamber. This arrangement can extend the life of the gas purify unit without the purity of the specific gas supplied to the second chamber unnecessarily decreasing, compared with the case when the gas is totally supplied to the gas purify unit.

In this case, the gas circulation system can further comprise a temperature adjustment unit that has a chemical filter which removes impurities in the merged gas having passed through the gas supply route, and adjusts the gas to a predetermined temperature. In such a case, gas which purity has slightly decreased because of merging with the remaining gas after passing through the gas purify unit is supplied to the temperature adjustment unit, where the impurities in the gas supplied is removed by the chemical filter and the gas adjusted to a predetermined temperature. Then the gas is supplied to the second chamber. Accordingly, the specific gas supplied to the second chamber is gas with relatively high purity, with the impurities removed and temperature adjusted.

With the exposure apparatus in the present invention, the gas circulation system can further comprise a gas purify unit that purifies the gas collected from the first chamber and improves purity of the specific gas in the gas collected, without comprising the gas purity monitoring unit.

In this case, the gas circulation system can further comprise a gas supply route which separates the gas collected from the first chamber and partially supplies the gas to the gas purify unit and merges the gas partially supplied to the gas purify unit into remaining of the gas collected from the first chamber.

In this case, the gas circulation system can further comprise a temperature adjustment unit that has a chemical filter which removes impurities in the merged gas having passed through the gas supply route, and adjusts the gas to a predetermined temperature.

With the exposure apparatus in the present invention, the gas circulation system can further comprise a temperature adjustment unit that has a chemical filter which removes impurities in the gas collected from the first chamber, and adjusts the gas supplied to a predetermined temperature, even if the exposure apparatus does not comprise the gas purity monitoring unit, the gas purify unit, or the gas supply route.

With the exposure apparatus in the present invention, in the case the gas supply system is the gas circulation system, the first chamber and the second chamber can be sealed chambers in a state sealed externally.

In addition, in the lithographic process, by performing exposure using the exposure apparatus in the present invention, the transmittance of the energy beam can be maintained so that exposure control with high precision can be maintained for a long period of time, as well as decrease the usage amount of the specific gas (low absorptive gas). Accordingly, the running cost can be reduced without decreasing the yield of the device, and as a consequence, the productivity of the device can be improved. Therefore, from the second aspect of the present invention, a device manufacturing method using the exposure apparatus in the present invention is provided.

According to the third aspect of this invention, there is provided an exposure method to illuminate a mask with an energy beam from an energy beam source and transfer a pattern formed on the mask onto a substrate, the exposure method comprising: supplying a specific gas with a characteristic feature of having transmittance to the exposure beam to a first chamber being at least an arbitrary of at least one closed space arranged on an optical path of the energy beam in between the energy beam source and the substrate, exhausting internal gas from the first chamber, and supplying gas exhausted from the first chamber to the second chamber being at least an arbitrary of the closed space.

With this method, the specific gas with a predetermined purity is supplied to the first chamber, and the gas exhausted from the first chamber is collected and supplied to the second chamber. In this case, the specific gas that has circulated the first chamber and the purity slightly decreased due to degassing and the like is collected and supplied to the second chamber as the replacement gas. Therefore, by supplying the specific gas with high purity to the first chamber, and arranging a chamber where the optical path of the energy beam is relatively short and the effects of the energy beam transmittance decreasing due to absorption by impurities such as air in the optical path do not cause a serious problem as at least the second chamber, the transmittance of the energy beam (exposure light) can be maintained while sufficiently satisfying the purity of the specific gas required in the first chamber and the second chamber. In addition, the gas which circulates the first chamber is used as the replacement gas of the second chamber without being exhausted outside, thus, the usage efficiency of the specific gas can be improved, which leads to suppressing wasteful consumption of the specific gas (low absorptive gas).

In this case, the first chamber and the second chamber can be different chambers.

In this case, the first chamber can be a closed space formed in between a first optical element and a second optical element arranged in between the energy beam source and the substrate, and the second chamber can be a closed space which houses at least a part of a movable optical member arranged between the energy beam source and the substrate and a driving system which drives the optical member.

With the exposure method in the present invention, when the first chamber and the second chamber are different chambers, the first chamber can be a housing which houses at least one of an illumination optical system which illuminates the mask with the energy beam from the energy beam source and a projection optical system which projects the energy beam via the mask onto the substrate, and the second chamber can be at least one of a mask chamber which houses a mask stage holding the mask and a substrate chamber which houses a substrate stage holding the substrate.

With the exposure method in the present invention, impurities concentration of the gas exhausted from the first chamber can be monitored, and the gas exhausted from the first chamber can be exhausted outside when the impurities concentration exceeds a predetermined value.

With the exposure method in the present invention, the gas exhausted from the first chamber can be purified and purity of the specific gas in the gas exhausted from the first chamber increased.

With the exposure method in the present invention, the specific gas can be supplied to the first chamber while maintaining purity of the specific gas within a predetermined range and replenishing shortage externally, and the gas exhausted from the first chamber can be collected and supplied to the second chamber.

DESCRIPTION OF THE PREFERRED EMBODIMENTS

The First Embodiment

Figure 1:
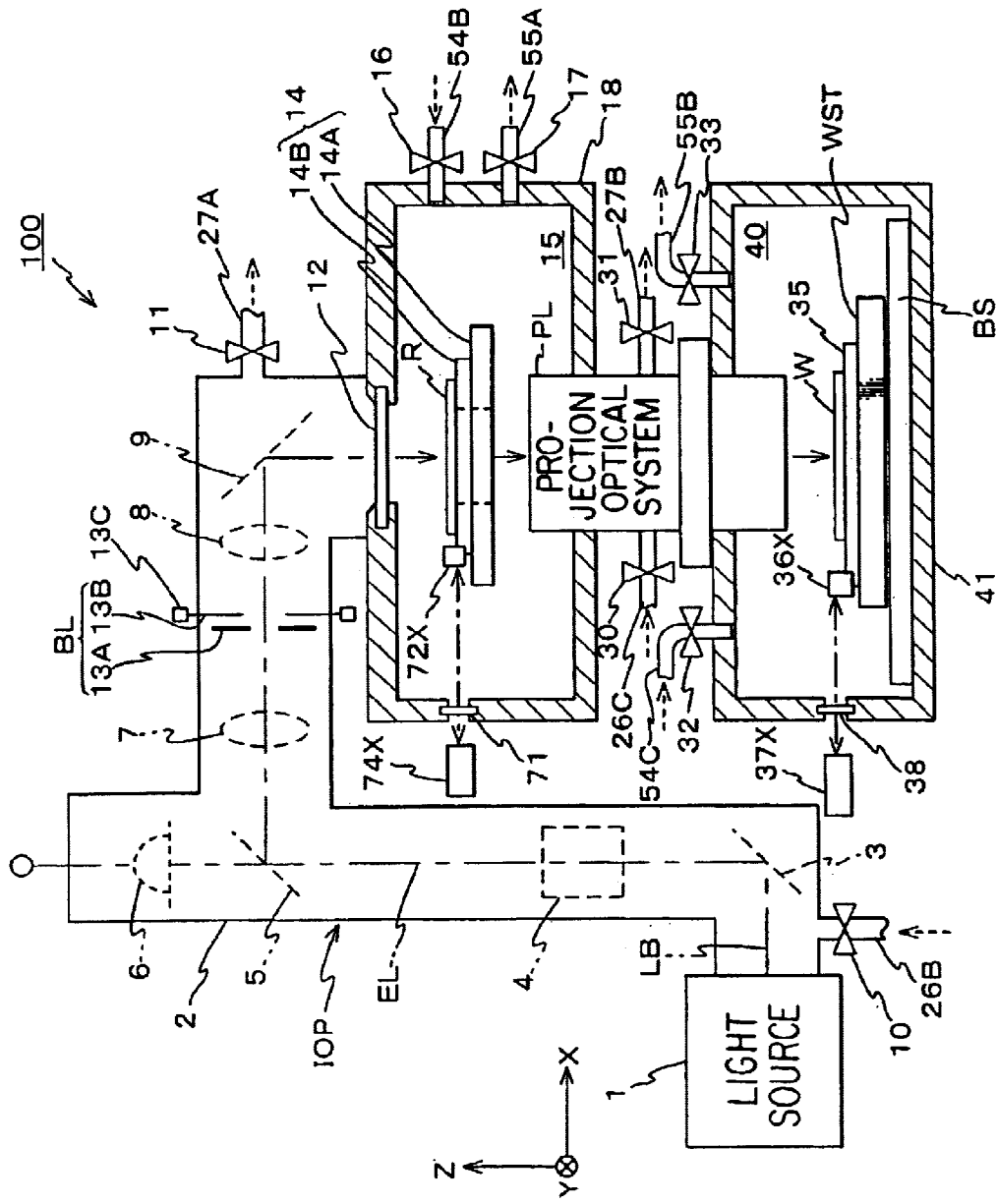
FIG. 1 is a schematic view showing the configuration of the exposure apparatus of the first embodiment in the present invention.

The first embodiment of the present invention will be described below with reference to FIGS. 1 to 3. FIG. 1 shows the schematic arrangement of an exposure apparatus according to the first embodiment. This exposure apparatus 100, irradiates an illumination light EL in the vacuum ultraviolet region serving as an energy beam onto the reticle R serving as a mask. It is a so-called scanning stepper, that is, a projection exposure apparatus based on the step-and-scan method, which relatively scans the reticle R and a wafer W serving as a substrate in a predetermined scanning direction (in this case, the X-axis direction) and transfers the pattern on the reticle R onto the wafer W via a projection optical system PL.

The exposure apparatus 100 includes a light source 1 serving as an energy beam source and an illumination optical system IOP, and comprises: an illumination system which illuminates the reticle R with the illumination light EL (hereinafter referred to as "exposure light") for exposure; a reticle stage 14 serving as a mask stage which holds the reticle R; the projection optical system PL which projects the exposure light EL outgoing from the reticle R onto the wafer W; a wafer stage WST serving as a substrate stage which holds the wafer W, and the like.

As the light source 1, a light source which emits light belonging to the vacuum ultraviolet region having a wavelength of about 120 nm to 180 nm is used. For example, the light source may be a fluorine laser ($F_2$ laser) which emits an $F_2$ laser beam having a wavelength of 157 nm, or the Krypton dimer laser ($Kr_2$ laser) which emits a $Kr_2$ laser beam having a wavelength of 146 nm, or the Argon dimer laser ($Ar_2$ laser) which emits an $Ar_2$ laser beam having a wavelength of 126 nm. Furthermore, an ArF excimer laser having a wavelength of 193 nm may be used as the light source.

The illumination optical system IOP has the structure including: an illumination system housing 2 serving as a housing; a deflection mirror 3 arranged within the illumination system housing 2 at a predetermined positional relationship; an optical integrator 4 such as a fly-eye lens; a beam splitter 5 which has a high reflection and low transmittance ratio; relay lenses 7 and 8; a reticle blind mechanism BL serving as afield stop; a deflection mirror 9, and the like. The reticle blind mechanism BL is arranged on a surface slightly defocused from the conjugate surface in respect to the pattern surface of the reticle R. It includes a fixed reticle blind 13A which has an opening portion of a predetermined shape formed to set the illumination area on the reticle R. It also includes a movable reticle blind 13B, which is arranged in the vicinity of the fixed reticle blind 13A on the conjugate surface in respect to the pattern surface of the reticle R, and has an opening portion where its position and width is variable in the direction corresponding to the scanning direction. The opening portion of the fixed reticle blind 13A is formed in the center of the circular field of the projection optical system PL. It is formed in a slit shape or a rectangular shape so that it linearly extends in the Y-axis direction, which is perpendicular to the moving direction of the reticle R during scanning exposure (X-axis direction).

In this case, at the beginning and end of scanning exposure, by further limiting the illumination area via the movable reticle blind 13B, exposure on unnecessary portions can be avoided. The movable reticle blind 13B is controlled by the main controller 70 (not shown in FIG. 1, refer to FIG. 3), which will be described later, via a blind driving unit 13C. Also, a light amount monitor 6 consisting of a photoelectric conversion element is arranged on the optical path of the light passing through the beam splitter 5.

The operation of the illumination optical system IOP will now be briefly described. The optical path of the beam in the vacuum ultraviolet region (laser beam) LB emitted almost horizontally from the light source 1, is deflected at an angle of 90° by the deflection mirror 3, and the laser beam LB is incident on the optical integrator 4. The optical integrator 4, then converts the laser beam LB into the exposure light LB which intensity distribution is almost uniform. Most of the exposure light LB (around 97%) is reflected off the beam splitter 5, and illuminates the fixed reticle blind 13A via the relay lens 7 with uniform illumination. The exposure light EL which has passed through the fixed reticle blind 13A, then passes through the movable reticle blind 13B and proceeds to the relay lens 8, the deflection mirror 9, through the light transmittance window 12, and onto the predetermined illumination area (an illumination area extending linearly in the Y-axis direction in a slit shape or rectangular shape) of the reticle R and illuminates the area with uniform illumination distribution.

Figure 3:
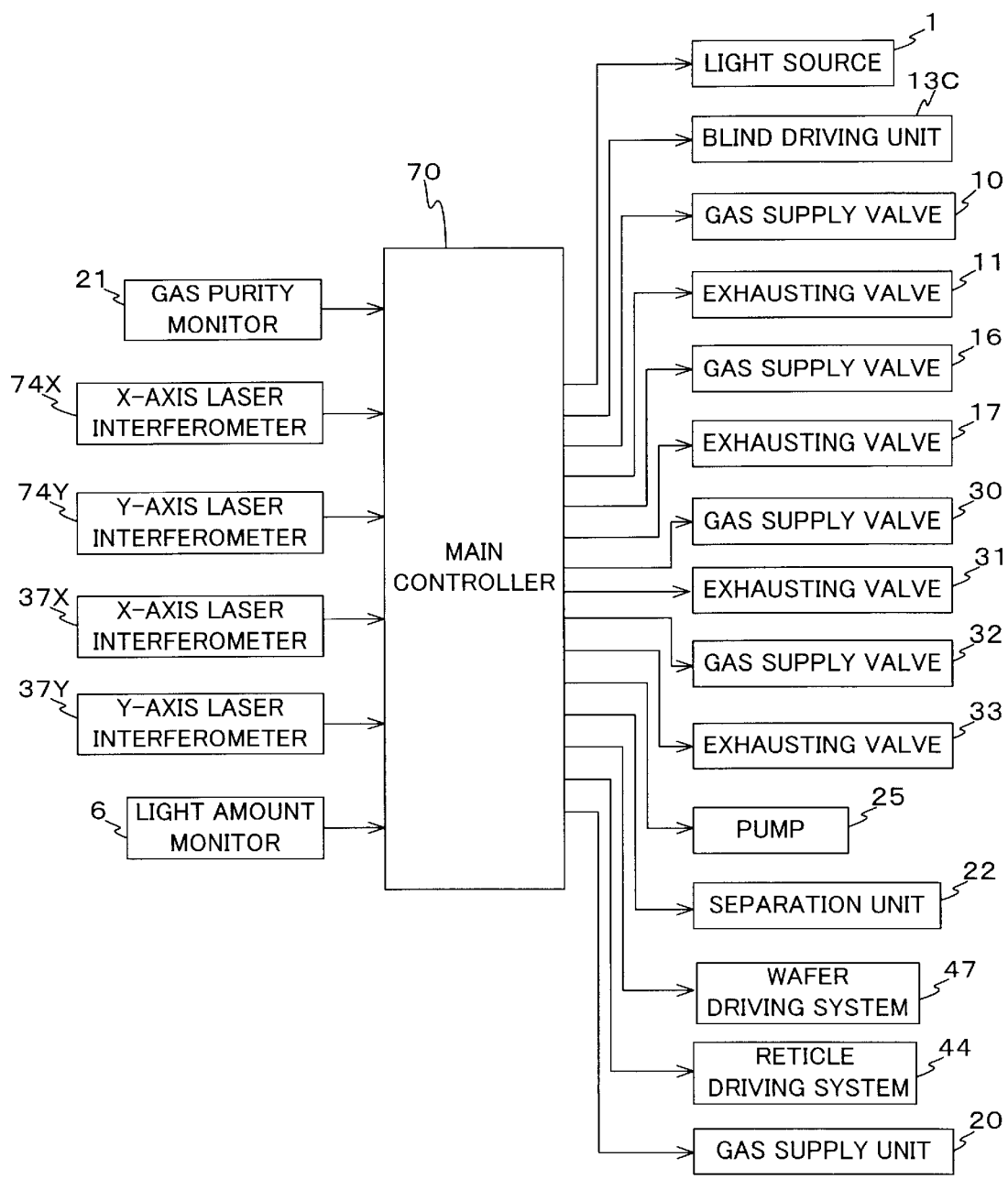
FIG. 3 is a block diagram showing the main structure of the control system of the exposure apparatus in FIG. 1.

The remaining exposure light EL which has passed through the beam splitter 5 (around 3%) is photo-detected by the light amount monitor 6, photo-electrically converted, and the photoelectric conversion signal is sent to the main controller 70 (refer to FIG. 3). When the light source 1 starts emission, the main controller 70 assumes the illumination of the image plane (surface of the wafer W) by a predetermined calculation based on the output of the light amount monitor 6. And based on the assumption results, the main controller 70 controls the exposure amount provided on the respective points on the wafer W.

In the case of using light with the wavelength in the vacuum ultraviolet region as the exposure light, gas such as oxygen, water vapor, and hydrocarbon that have high absorptive characteristics to light in such wavelength bandwidth (hereinafter referred to as "absorptive gas" as appropriate) need to be eliminated from the optical path. Therefore, in the embodiment, a specific gas with high purity that has a low absorptive characteristic to light in the vacuum ultraviolet region such as nitrogen, helium, argon, neon, or krypton, or a concentration of these gases, (hereinafter referred to as "low absorptive gas" as appropriate) is constantly supplied (and circulated) to the interior of the illumination system housing 2 by a gas supply system which will be described later in the description. As a consequence, the concentration of impurities such as absorptive gas or organic contaminants that exist in the low absorptive gas within the illumination system housing 2 does not exceed 1 ppm.

The reticle stage 14 holds the reticle R, and is arranged within a reticle chamber 15 serving as a mask chamber (and a second space). The reticle chamber 15 is covered with a separating wall 18, which is tightly connected without any gap to the illumination system housing 2 and the barrel of the projection optical system, and the gas inside is sealed from the outside. The separating wall 18 of the reticle chamber 15 is made of material such as stainless (SUS), which is strong against degassing.

On the ceiling portion of the separating wall 18 of the reticle chamber 15, an opening is formed that is slightly smaller than the reticle R. The light transmittance window 12 is arranged in this opening portion in a state separating the interior space of the illumination system housing 2 and the interior space of the reticle chamber 15 where the reticle R used for exposure is to be arranged. Since the light transmittance window 12 is arranged on the optical path of the exposure light EL irradiated from the illumination optical system onto the reticle R, it is made of crystal material such as fluorite having high transmittance to light in the vacuum ultraviolet region like the exposure light.

The reticle stage 14 linearly drives the reticle R in large strokes on the reticle base supporting bed (not shown in Figs.) in the X-axis direction, and also has a structure capable of finely driving the reticle R in the Y-axis direction and the θz direction (rotational direction around the Z-axis)

More particularly, the arrangement of the reticle stage 14 includes: a reticle scanning stage 14A which is driven in the X-axis direction in predetermined strokes on a reticle base supporting bed (not shown in Figs.) by a reticle driving system 44 which includes a linear motor and the like; and a reticle holder B which holds the reticle R mounted on the reticle scanning stage 14A by suction. The reticle holder 14B is structured so that it is capable of being finely driven (including rotation) within the XY plane by the reticle driving system 44.

Within the reticle chamber 15, a gas supply system that will be described later on, continuously supplies (creates a flow of) low absorptive gas. The purity of this gas is slightly lower than the absorptive gas supplied to the illumination system housing 2. This is because with the exposure apparatus using exposure wavelength in the vacuum ultraviolet region, in order to avoid the exposure light from being absorbed by absorptive gas such as oxygen, the vicinity of the reticle R also needs to be filled with the low absorptive gas. As a consequence, the concentration of the absorptive gas in the low absorptive gas and impurities such as organic contaminants in the reticle chamber 15 does not exceed the extent of several On the −X side of the side wall of the separating wall 18 of the reticle chamber 15, a light transmittance window 71 is arranged. Similarly, although it is omitted in the drawings, a transmittance window is arranged on the +Y side (in the depth of FIG. 1) of the side wall of the separating wall 18. These light transmittance windows are formed by fitting a light transmittance member, in this case an ordinary optical glass material, into the respective window portions (opening portion) made in the separating wall 18. In this case, in order to prevent gas leaking from the portion where the glass material structuring the transmittance window 71 is attached, metallic seals made of indium or copper, or a sealing by fluorinated resin, is arranged on this portion. In this case, as the fluorinated resin, it is preferable to use the material which has been heat-treated for 2 hours at a temperature of 80° C. and has gone through degassing process.

On the edge of the reticle holder 14B on the −X side, an X movable mirror 72X made of a planar mirror is arranged extending in the Y-axis direction. An X-axis laser interferometer 74X is arranged almost perpendicular to the X movable mirror 72X outside the reticle chamber 15, and the measurement beam from the X-axis laser interferometer 74X is projected on the X movable mirror 72X via the light transmittance window 71. The beam reflected, is photo-detected by the detector within the laser interferometer 74X via the transmittance window 71, and the position of the X movable mirror 72X, in other words, the X position of the reticle R, is detected with the position of the reference mirror within the laser interferometer 74X as a reference.

Similarly, although it is omitted in the drawings, on the edge of the reticle holder 14B on the +Y side, a Y movable mirror made of a planar mirror is arranged extending in the X-axis direction. And a Y-axis laser interferometer 74Y (refer to FIG. 3) detects the position of the Y movable mirror, in other words, the Y position of the reticle R, through the Y movable mirror in the same manner as described above. The detection values (measurement values) of the two laser interferometers 74X and 74Y are sent to the main controller 70 (refer to FIG. 3), and the main controller 70 controls the position of the reticle stage 14 via the reticle driving system 44, based on the detection values of the laser interferometers 74X and 74Y.

In this manner, in the embodiment, the laser interferometer made up of the laser light source, optical members such as the prism, and the detector, is arranged outside the reticle chamber 15. Therefore, in the event that the detector structuring the laser interferometer does generate an extremely small amount of absorptive gas, there is no serious effect on the exposure performed.

With the projection optical system PL, lenses made of fluoride crystal such as lithium fluoride and an optical system made up of reflection mirrors are sealed in a barrel which serves as a housing. In this embodiment, as the projection optical system PL, a reduction optical system that has a projection magnification β of, for example, ¼ or ⅕ is used. Therefore, as is described earlier, when the reticle R is illuminated by the exposure light EL from the illumination optical system, the circuit pattern formed on the reticle R is reduced and projected on the respective shot areas of the wafer W by the projection optical system PL, and the reduced image of the circuit pattern is transferred and formed on the wafer W.

With the exposure apparatus using the exposure wavelength in the vacuum ultraviolet region as in this embodiment, in order to avoid the exposure light from being absorbed by absorptive gas such as oxygen, the housing (barrel) of the projection optical system PL also needs to be filled with the low absorptive gas (specific gas). Therefore, in this embodiment, a gas supply system that will be described later on, continuously supplies (creates a flow of) a low absorptive gas into the barrel of the projection optical system PL. The purity level of this gas is the same as that of the absorptive gas supplied to the illumination system housing 2. As a consequence, the concentration of the absorptive gas in the low absorptive gas and impurities such as organic contaminants within the barrel of the projection optical system PL does not exceed 1 ppm.

The wafer stage WST is arranged inside a wafer chamber 40. The wafer chamber 40 is covered with a separating wall 41, which is tightly connected without any gap to the barrel of the projection optical system PL, and the gas inside is sealed from the outside. The separating wall 41 of the wafer chamber 40 is made of material such as stainless (SUS), which is strong against degassing.

The wafer stage WST is driven freely along the upper surface of the base BS within the XY plane in a non-contact manner by a wafer driving system 47 (not shown in FIG. 1, refer to FIG. 3). The wafer driving system is made up of, for example, a linear motor, or a magnetic levitation two dimensional linear actuator (a planar motor).

On the wafer stage WST, a wafer holder 35 which holds the wafer W by suction, is mounted.

With the exposure apparatus which uses the exposure wavelength in the vacuum ultraviolet region, in order to avoid the exposure light from being absorbed by absorptive gas such as oxygen, the optical path from the projection optical system PL to the wafer W also needs to be filled with the low absorptive gas referred to earlier. Therefore, in this embodiment, a gas supply system that will be described later on, continuously supplies (creates a flow of) a low absorptive gas into the wafer chamber 40. The purity level of this gas is the same as that of the absorptive gas supplied to the reticle chamber 15. As a consequence, the concentration of the absorptive gas in the low absorptive gas and impurities such as organic contaminants within the wafer chamber 40 does not exceed several ppm.

On the −X side of the side wall of the separating wall 41 of the wafer chamber 40, a light transmittance window 38 is arranged. Similarly, although it is omitted in the drawings, a transmittance window is arranged on the +Y side (in the depth of FIG. 1) of the side wall of the separating wall 41. These light transmittance windows are formed by fitting a light transmittance member, in this case an ordinary optical glass material, into the respective window portions (opening portion) made in the separating wall 41. In this case, in order to prevent gas leaking from the portion where the glass material structuring the transmittance window 38 is attached, metallic seals made of indium or copper, or a sealing by fluorinated resin, is arranged on this portion. In this case, as the fluorinated resin, it is preferable to use the material which has been heat-treated for 2 hours at a temperature of 80° C. and has gone through degassing process.

On the edge of the wafer holder 35 on the −X side, an X movable mirror 36X made of a planar mirror is arranged extending in the Y-axis direction. An X-axis laser interferometer 37X is arranged almost perpendicular to the X movable mirror 36X outside the wafer chamber 40, and the measurement beam from the X-ax is laser interferometer 37X is projected on the X movable mirror 36X via the light transmittance window 38. The beam reflected, is photodetected by the detector within the laser interferometer 37X via the transmittance window 38, and the position of the X movable mirror 36X, in other words, the X position of the wafer W, is detected with the position of the reference mirror within the laser interferometer 37X as a reference.

Similarly, although it is omitted in the drawings, on the edge of the wafer holder 35 on the +Y side, a Y movable mirror made of a planar mirror is arranged extending in the X-axis direction. And a Y-axis laser interferometer 37Y (not shown in FIG. 1, refer to FIG. 3) detects the position of the Y movable mirror, in other words, the Y position of the wafer W, through the Y movable mirror in the same manner as described above. The detection values (measurement values) of the two laser interferometers 37X and 37Y are sent to the main controller 70, and the main controller 70 controls the position of the wafer stage WST via the wafer driving system 47 (refer to FIG. 3), while monitoring the detection values of the laser interferometers 37X and 37Y.

In this manner, in the embodiment, the laser interferometer made up of the laser light source, optical members such as the prism, and the detector, is arranged outside the wafer chamber 40. Therefore, in the event that the detector structuring the laser interferometer does generate an extremely small amount of absorptive gas, this has no serious effect on the exposure performed.

Figure 2:
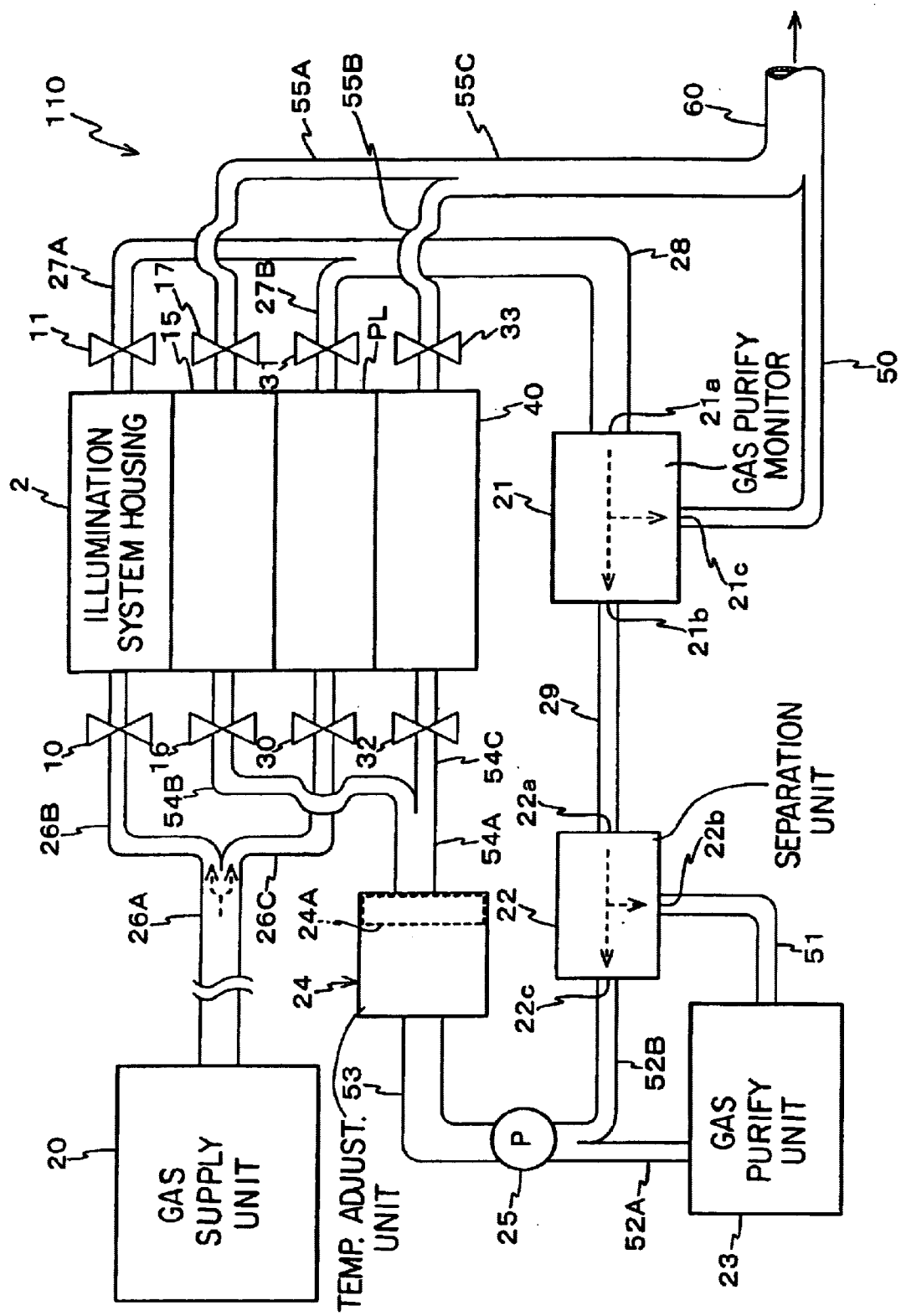
FIG. 2 is a simplified view showing the gas supply system arrangement of the exposure apparatus in FIG. 1.

Following is the description of the gas supply system of the exposure apparatus 100, with reference to FIG. 2 and other drawings as appropriate. The structure of the gas supply system 110 of the exposure apparatus 100 is simplified, in FIG. 2.

As is obvious from FIG. 2, the gas supply system 110 shown in the drawing supplies a specific gas (low absorptive gas) with high purity from a gas supply unit 20 to the illumination system housing 2 and to the barrel of the projection optical system PL. It also collects the gas exhausted respectively from the illumination system housing 2 and the projection optical system PL. The gas supply system 110 then carries the collected gas through a predetermined route, and supplies the gas serving as a replacement gas to the reticle chamber 15 and the wafer chamber 40, and then exhausts the gas into the storage chamber (not shown in Figs.).

The gas supply system 110 comprises: the gas supply unit 20; a gas purity monitor 21 serving as a unit to monitor the purity of the gas; a separation unit 22; a gas purify unit 23; a temperature adjustment unit 24; a pump 25; a piping system, and the like.

The gas supply unit 20 carries a cylinder (or a tank) which holds the low absorptive gas with high purity (concentration of impurity not exceeding 1 ppm), a pump, a temperature adjustment unit, and the like (all not shown in Figs.). One end of the main gas supply piping 26A is connected to this gas supply unit 20, and the other end is divided into two, that is, branch piping 26B and 26C. The end opposite to the main gas supply piping 26A of the branch piping 26B is connected to the illumination system housing 2 on the light source 1 side, as is shown in FIG. 1. And a gas supply valve 10 is arranged in the vicinity of the connected portion of the branch piping 26B to the illumination system housing 2.

The end opposite to the main gas supply piping 26A of the branch piping 26C is connected to the barrel of the projection optical system PL, as is shown in FIG. 1. And a gas supply valve 30 is arranged in the vicinity of the connected portion of the branch piping 26C to the projection optical system PL.

One end of an exhausting branch piping 27A is connected to the side furthest from the light source 1 of the illumination optical system 2, as is shown in FIG. 1, and in the vicinity of the connected portion of the exhausting branch piping 27A to the illumination optical system 2, an exhausting valve 11 is arranged.

Also, on the opposite side of which the branch piping 26C is connected, one end of an exhausting branch piping 27B is connected to the barrel of the projection optical system PL, as is shown in FIG. 1. And an exhausting valve 31 is arranged in the vicinity of the connected portion of the exhausting branch piping 27B to the projection optical system PL.

The other end of the exhausting branch piping 27A and 27B come together and is connected to one end of a collection piping 28. The other end of the collection piping 28 is connected to the gas supply port 21a of the gas purity monitor 21.

The gas purity monitor 21 incorporates a gas sensor, which detects the concentration of absorptive gas such as oxygen and ozone in the gas flowing in from the gas supply port 21a. The gas purity monitor 21 also has a first and second exhausting port 21b and 21c. These exhausting ports 21b and 21c, and the gas supply port 21a are connected to one another via a direction control valve. And the gas purity monitor 21 incorporates a controller that switches the direction of the direction control valve to exhaust the gas via the second exhausting port 21c when the concentration of oxygen and ozone detected by the gas sensor exceeds a predetermined threshold value set in advance. The controller also switches the direction of the direction control valve to exhaust the gas via the first exhausting port 21b, when the concentration of oxygen and ozone detected by the gas sensor does not reach a predetermined threshold value set in advance. In addition, in the embodiment, the detection values of the gas sensor are also sent to the main controller 70 (refer to FIG. 3). In this case, the first exhausting port 21b of the gas purity monitor 21 is connected to a gas supply port 22a of the separation unit 22 via piping 29, and the second exhausting port 21c is connected to the storage chamber (not shown in Figs.) via the exhausting branch piping 50 and main exhausting pipe 60.

The separation unit 22 has a first and second exhausting port 22b and 22c. These exhausting ports 22b and 22c, and the gas supply port 22a are connected to one another via a piping system not shown in Figs. In this piping, an adjustment valve capable of adjusting the opening (or the angle) is provided. And by adjusting the opening of the adjustment valve, the separation proportion of the gas supplied to the exhausting ports 22b and 22c is adjusted. The main controller 70 controls the adjustment valve, in correspondence with the detection values of the gas sensor incorporated in the gas purity monitor 21 (refer to FIG. 3). The first exhausting port 22b of the separation unit 22 is connected to one end of piping 51, and the other end of the piping 51 is connected to the entrance of the gas purify unit 23.

As the gas purify unit 23, a chemical filter to remove absorptive gas such as oxygen, and a HEPA filter (high efficiency particulate air-filter) or an ULPA filter (ultra low penetration air-filter) to remove dust (particles) are used, and a purifying unit based on the getter method which increases the purity (concentration of the low absorptive gas) of the gas by removing the impurities in the gas flowing in from the entrance is used. Alternatively, as the gas purify unit 23, a purifying unit that liquefies the gas flowing in from the entrance by using a cryopump and separates the impurities in the gas with the low absorptive gas by making use of the temperature difference when vaporizing the liquefied gas, can be used.

On the discharge opening (exit) of the gas purify unit 23, one end of piping 52A is connected. The other end of the piping 52A is connected to one side of the pump 25, along with one end of piping 52B. The other end of the piping 52B is connected to the second exhausting port 22c of the separation unit 22. The other side of the pump 25 is connected to the entrance of the temperature adjustment unit 24 via piping 53.

The temperature adjustment unit 24 incorporates a cooler, a heater, a temperature sensor, a controller which controls the cooler and the heater so that the gas flowing in from the entrance is adjusted to a predetermined temperature based on the detection values of the temperature sensor, and the like. Also, a filter unit 24A is arranged in the vicinity of the exit in the temperature adjustment unit 24. The filter 24A includes a filter that removes dust (particles) such as the HEPA filter or the ULPA filter (hereinafter referred to in general as an "air filter"), and a chemical filter which removes absorptive gas such as oxygen. One end of piping 54A is connected to the exit of the temperature adjustment unit 24, and the other end of the piping 54A is divided into two branches, 54B and 54C.

The opposite end of the branch piping 54B and 54C to the piping 54A, are respectively connected to the reticle chamber 15 and the wafer chamber 40. Also, in the vicinity of the connected portion of the branch piping 54B and 54C to the reticle chamber 15 and the wafer chamber 40, gas supply valves 16 and 23 are respectively arranged, as is shown in FIG. 1. Also, as is shown in FIG. 1, one end of the exhausting branch piping 55A and 55B are respectively connected to the reticle chamber 15 and the wafer chamber 40. And in the vicinity of the connected portion of the exhausting branch piping 55A and 55B to the reticle chamber 15 and the wafer chamber 40, exhausting valves 17 and 33 are respectively arranged. The other end of the exhausting branch piping 55A and 55B come together, as is shown in FIG. 2, and is connected to the exhausting piping 55C.

As the gas supply valves 10, 16, 30, and 32, and the exhausting valves 11, 17, 31, and 33, in the embodiment, flow rate control valves which valve opening is adjustable are used. The main controller 70 controls these valves.

FIG. 3 shows the main arrangement of the control system of the exposure apparatus 100 related to the embodiment in a block diagram. The main controller 70, consisting of a microcomputer (or a workstation) carries a CPU (Center Processing Unit), a ROM (Read Only Memory), a RAM (Random Access Memory) and the like, and plays the main role in the control system. The main controller 70 performs the overall control of the apparatus.

Next, the supply/exhausting operation of the exposure apparatus in the embodiment of low absorptive gas to the illumination system housing 2, the reticle chamber 15, the projection optical system PL, and the wafer chamber 40 will be described.

On initial gas replacement such as the start-up of the apparatus, the main controller 70 completely opens the gas supply valves 10, 16, 30, and 32, and the exhausting valves 11, 17, 31, and 33. This is performed based on the instructions from the operator, and the main controller 70 then instructs the gas supply unit 20 to start supplying the gas. With this operation, low absorptive gas with high purity which temperature is adjusted to a predetermined level begins to be supplied from the gas supply unit 20 to the illumination system housing 2 via the main gas supply piping 26A and the branch piping 26B. And at the same time, low absorptive gas with high purity begins to be supplied to (the barrel of) the projection optical system PL via the branch piping 26C. The initial gas replacement begins in this manner.

In correspondence with the start of supplying low absorptive gas as is described above, the internal gas within the illumination system housing 2 and the projection optical system PL is exhausted into the collection piping 28 via the exhausting branch piping 27A and 27B. The gas exhausted into the collection piping 28 flows into the gas purity monitor 21 via the gas supply port 21a. With the gas purity monitor 21, the gas sensor detects the concentration of the absorptive gas such as oxygen and ozone, and the controller decides whether the concentration of the absorptive gas exceeds the threshold value set in advance. In this case, since it is immediately after the start of the initial gas replacement, the gas from the collection piping 28 (hereinafter also referred to as "collected gas" for the sake of convenience) contains a large amount of air (oxygen). Therefore, the controller switches the direction valve so that the collected gas is exhausted from the second exhausting port 21c. By this operation, the collected gas is exhausted to the storage chamber (not shown in Figs.) via the exhausting branch piping 50. The detection values of the gas sensor in the gas purity monitor 21 are also sent to the main controller 70.

The state described above is maintained until a predetermined period of time has elapsed, and the collected gas from the illumination system housing 2 and the projection optical system PL is exhausted to the storage chamber (not shown in Figs.).

After a predetermined period of time has elapsed from the beginning of initial gas replacement, the internal gas of the illumination system housing 2 and the projection optical system PL is almost totally replaced with the low absorptive gas supplied from the gas supply unit 20. Immediately after the replacement, the concentration of absorptive gas in the collected gas flowing into the gas purity monitor 21 via the collection piping 28 decreases. When the concentration falls under a predetermined value, the controller of the gas purity monitor 21 decides that the concentration of the absorptive gas is under the threshold value set in advance based on the detection values of the gas sensor, and switches the direction control valve so that the collected gas is exhausted via the first exhausting port 21b. While this is being performed, the main controller 70 acknowledges that the initial gas replacement of the illumination system housing 2 and the projection optical system PL has been completed, and operates the pump 25. The main controller 70 also adjusts the opening degree of the adjustment valve of the separation unit 22 in accordance with the detection values of the gas sensor, and adjusts the proportion of the collected gas exhausted respectively from the exhausting port 22b and 22c.

The main controller 70, in this case, adjusts the adjustment valve of the separation unit 22 so that when the detection values of the gas sensor is large, more collected gas is supplied to the piping 51 side (the gas purify unit 23 side). Whereas, when the detection values of the gas sensor is small, more collected gas is supplied to the piping 52B side.

With this operation, the collected gas exhausted from the first exhausting port 21b of the gas purity monitor 21 flows into the gas separation unit 22 via the piping 29 and the gas supply port 22a. And the gas separation unit 22 separates the gas flow so that the gas is exhausted respectively from the first exhausting port 22b and the second exhausting port 22c.

The collected gas partially exhausted from the first exhausting port 22b flows into the gas purify unit 23 via the piping 51, and impurities such as absorptive gas are removed while the gas flows through the gas purify unit 23. The gas is then exhausted to the piping 52 as a low absorptive gas with increased purity. The low absorptive gas with the increased purity comes together with the remaining collected gas which is exhausted to the piping 52B from the second exhausting port 22c, just before flowing into the pump 25. The increased purity of the low absorptive gas decreases slightly by coming together, and the low absorptive gas with the slightly decreased purity flows into the temperature adjustment unit 24 via the piping 53 by the pump 25.

In the temperature adjustment unit 24, the controller controls the cooler and the heater so that the temperature of the gas flowing into the temperature adjustment unit 24 is at a predetermined temperature based on the detection values of the temperature sensor. When the gas which temperature is controlled passes through the filter unit 24A, chemical impurities such as absorptive gases, and particles, and the like are removed. The gas is then exhausted to the piping 54A as a recycled replacement low absorptive gas. And the recycled replacement low absorptive gas is supplied to the reticle chamber 15 and the wafer chamber 40 via the branch piping 54B and 54C respectively. In response to the flow of the recycled replacement low absorptive gas, the gas within the reticle chamber 15 and the wafer chamber 40 is exhausted to the exhausting piping 55C via the exhausting branch piping 55A and 55B respectively. That is, the initial gas replacement of the reticle chamber 15 and the wafer chamber 40 begins in this manner. The gas exhausted to the exhausting piping 55C is exhausted to the storage chamber (not shown in Figs.) via the main exhausting pipe 60.

When a predetermined period of time elapses from the start of the initial gas replacement in the reticle chamber 15 and the wafer chamber 40, the initial gas replacement operation that includes the initial gas replacement of these chambers is completed. In this embodiment, however, the main controller 70 measures the elapsing time from when the pump 25 starts operating with a timer (not shown in Figs.). And when the elapsed time reaches a fixed time T, which is set in advance, the main controller 70 decides that the initial gas replacement has been completed. When the main controller 70 decides that the initial gas replacement is completed in this manner, it then respectively sets the opening degree of the gas supply valve 10, 16, 30, and 32 and the exhausting valve 11, 17, 31, and 33 to a value corresponding to each target flow rate that is determined in advance. Thus, the state moves into a gas purity maintenance state where the purity of the low absorptive gas within the illumination system housing 2, the reticle chamber 15, the projection optical system PL, and the wafer chamber 40 is respectively maintained at each target value.

Alternatively, a detection unit such as a gas sensor can be arranged within at least either the reticle chamber 15 or the wafer chamber 40, to detect the concentration of the low absorptive gas or the concentration of impurities such as absorptive gas inside the chamber. In this case, the main controller 70 can decide that the concentration of impurities has fallen below a predetermined concentration based on the detection values of the detection unit, and may of course decide that the initial gas replacement has been completed at this point.

After the initial gas replacement has been completed, the gas purity maintenance state continues and the purity of the low absorptive gas within the illumination system housing 2, the reticle chamber 15, the projection optical system PL, and the wafer chamber 40, is maintained at the respective target values. Therefore, the concentration of impurities such as absorptive gas in the low absorptive gas inside the illumination system housing 2 and the projection optical system PL is maintained under 1 ppm. And the concentration of impurities such as absorptive gas in the low absorptive gas in the reticle chamber 15 and the wafer chamber 40 is maintained under several ppm.

During the gas purity maintenance state (when the gas purity is maintained), the main controller 70 monitors the detection values of the gas sensor in the gas purity monitor 21 at all times. And in correspondence with the detection values, the main controller 70 adjusts the adjustment valve of the separation unit 22 at all times following the criteria referred to earlier. Thus, the purity of the low absorptive gas within the reticle chamber 15 and the wafer chamber 40 is maintained at a predetermined range. In addition, the gas monitor 21 monitors the gas purity of the collected gas at all times, also in the gas purity maintenance state. And when the gas monitor 21 detects that the concentration of impurities such as absorptive gas has exceeded a predetermined value, it exhausts the collected gas from the second exhausting port 21c.

The exposure operations of the exposure apparatus 100 related to the embodiment will be described next, with reference to FIGS. 1 and 3 and mainly following the control operations of the main controller 70.

As a premise, various conditions for exposure are set in advance to perform scanning exposure on the shot areas on the wafer W at an appropriate exposure amount (target exposure amount). Also, preparatory operations such as reticle alignment and baseline alignment using a reticle microscope (not shown in Figs.) and an off-axis alignment sensor (also not shown in Figs.) is performed. When these are completed, fine alignment (EGA (Enhanced Global Alignment) and the like) of the wafer W using an alignment sensor is performed, and arrangement coordinates of a plurality of shot areas on the wafer W is obtained. Preparatory operations such as the reticle alignment and the baseline alignment are disclosed in detail in, for example, U.S. Pat. No. 5,243,195. The EGA that follows is disclosed in detail in, for example, U.S. Pat. No. 4,780,617. The disclosures cited above are fully incorporated herein by reference.

In this manner, when preparatory operations are completed to perform exposure on the wafer W, the main controller 70 moves the wafer stage WST via the wafer driving system 47 to the scanning starting position of the first shot (the first shot area) of the wafer W. While this is being performed, the main controller 70 also monitors the measurement values of the X-axis laser interferometer 37X and the Y-axis laser interferometer 37Y on the wafer side based on the alignment results.

The main controller 70 then starts scanning the reticle stage 14 and wafer stage WST in the X direction via the reticle driving system 44 and the wafer driving system 47. And when both stages 14 and WST reach the target scanning velocity, the pattern area of the reticle R begins to be illuminated by the exposure light EL, and scanning exposure begins.

The light source 1 starts emission prior to the scanning exposure, however, the main controller 70 controls the movement of each blade of the movable reticle blind 13B structuring the reticle blind BL via the blind driving unit 13C in synchronous with the movement of the reticle stage 14. Therefore, the irradiation of the exposure light EL onto areas other than the pattern area is avoided, as is with the scanning steppers in general.

The main controller 70 synchronously controls the reticle stage 14 and the wafer stage WST so that especially during the scanning exposure described earlier, the movement velocity Vr of the reticle stage 14 in the X-axis direction and the movement velocity Vw of the wafer stage WST in the X-axis direction is maintained at a velocity ratio which corresponds to the projection magnification β of the projection optical system PL.

And different pattern areas of the reticle R are sequentially illuminated with the ultraviolet pulse light, and by completing the illumination of the entire pattern area, the scanning exposure of the first shot on the wafer W is completed. Thus, the circuit pattern formed on the reticle R is reduced and transferred onto the first shot via the projection optical system PL.

When scanning exposure on the first shot is completed in this manner, the main controller 70 steps the wafer stage WST in the X-axis and Y-axis directions to move it to the scanning starting position of the second shot (the second shot area) Upon this stepping operation, the main controller 70 measures realtime the positional deviation of the wafer stage WST in the X, Y, and θz direction (rotation around the Z-axis) based on the measurement values of the laser interferometer 37X and 37Y on the wafer side. And based on the measurement results, the main controller 70 controls the position of the wafer stage WST so that the XY positional deviation is set at a predetermined state.

In addition, the main controller 70 rotatably controls the reticle holder 14B on the reticle stage 14 to compensate for the rotational deviation error on the wafer W side, based on the deviation information of the wafer stage WST in the θz direction.

And the main controller 70 performs scanning exposure likewise as above on the second shot.

In this manner, scanning exposure of the shot area on the wafer W and stepping operations to expose the following shot area is repetitively performed, and the circuit pattern formed on the reticle R is sequentially transferred onto all the shot areas subject to exposure on the wafer W.

When scanning exposure is performed on each shot area on the wafer w, the illumination system housing 2, the projection optical system PL, and the like are purged with low absorptive gas with high purity at all times so that the optical properties can be brought to full scope. In addition, during scanning exposure, since the image forming characteristics of the projection optical system PL do not deteriorate with the elapse of time, the deterioration of the pattern transferred onto the wafer W can be avoided.

Although it is not pointed out specifically in the description above, temperature adjustment of the interior of the illumination system housing 2, the reticle chamber 15, the barrel of the projection optical system PL, the wafer chamber 40, and the like is performed with the same level of accuracy as is with the environmental chamber (not shown in Figs.). Also, although it is not specified above, portions such as the illumination system housing 2 where the low absorptive gas is directly in contact is preferably made of material such as stainless (SUS), which is strong against degassing, likewise with the barrel of the projection optical system PL, and the partition wall of the reticle chamber 15 and the wafer chamber 40. Or, the surface of the portion where the low absorptive gas is directly in contact, such as the illumination system housing 2, the reticle chamber 15, the barrel of the projection optical system PL, and the wafer chamber 40, may be coated with material such as fluorinated resin which does not generate absorptive gas such as hydrocarbon due to degassing.

As is described in detail, with the exposure apparatus 100 in the embodiment, the gas supply system 110 supplies a low absorptive gas with a predetermined purity to the illumination system housing 2 and the barrel (housing) of the projection optical system PL. During this operation, the gas exhausted from the illumination system housing 2 and the barrel of the projection optical system PL is collected. And, the collected gas is recycled and supplied to the reticle chamber 15 and the wafer chamber 40 through a predetermined route as a replacement gas (recycled replacement gas). In this case, since the collected gas flows through the illumination system housing 2 and the barrel of the projection optical system PL, the purity has decreased slightly due to degassing within the illumination system housing 2 and the barrel of the projection optical system PL. In the embodiment, however, the collected gas is partially supplied to the gas purify unit 23 to increase the purity via the separating unit 22 and then merged into the remaining collected gas. Furthermore, the temperature of the gas is adjusted to a predetermined level and becomes the recycled replacement gas. Therefore, the purity of the recycled replacement gas is slightly lower than the purity of the low absorptive gas supplied from the gas supply unit 20. And in the case the gas in the reticle chamber 15 and the wafer chamber 40 is replaced with the recycled replacement gas, the purge accuracy required can be solidly achieved.

Accordingly, in the embodiment, the purity of the low absorptive gas required in each chamber (2, PL, 15, and 40) can be sufficiently satisfied, and this is extremely effective to suppress the decrease in transmittance of the exposure light EL during operations such as exposure. In addition, the low absorptive gas that flows through the illumination system housing 2 and the barrel of the projection optical system PL is used as the replacement gas of the reticle chamber 15 and the wafer chamber 40. Therefore, the usage efficiency of the low absorptive gas can be improved, which leads to suppressing wasteful consumption of the low absorptive gas.

Also, in the embodiment, the gas supply system 110 has: a gas supplying route (piping 28, 29, 22, 51, 52A, and 52B) that separate the gas collected from the illumination system housing 2 and the barrel of the projection optical system PL (collected gas), supply the collected gas to the gas purify unit 23 in partial, and merge the partial gas into the remaining gas; the gas purify unit 23 which purifies the partial gas separated by the gas supplying route and increases the purity of the low absorptive gas in the collected gas; and the filter unit 24A which includes a chemical filter and an air filter to remove impurities in the gas supplied, the gas supplied being the merged gas of the gas with increased purity which has gone through the gas purify unit 23 and the remaining collected gas. The gas supply system also comprises the temperature adjustment unit 24 that supplies the gas having passed through the filter unit 24A and the temperature adjusted to a predetermined temperature to the reticle chamber 15 and the wafer chamber 40 as the recycled replacement gas. And by these structural elements, the collected gas is recycled as the recycled replacement gas as is described earlier in the description. Therefore, low absorptive gas with relatively high purity, which impurities are removed and temperature adjusted (the recycled replacement gas), is supplied to the reticle chamber 15 and the wafer chamber 40.

Furthermore, with the exposure apparatus 100 in the embodiment, it comprises the gas purity monitor 21 which monitors the concentration of impurities in the gas exhausted (collected) from the illumination system housing 2 and the barrel of the projection optical system PL. And, in the case the concentration of impurities is above a predetermined value, the gas purity monitor 21 exhausts the gas outside. Therefore, the gas purity monitor 21 monitors the concentration of impurities in the gas exhausted from the illumination system housing 2 and the barrel of the projection optical system PL, and gas which concentration of impurities is higher than the predetermined value is exhausted outside. Thus, the life of the gas purify unit 23 can be extended since the impurity level of the gas supplied to the gas purify unit 23 does not exceed a certain level during the gas purity maintenance state, needles to say during the initial gas replacement.

Meanwhile, in the case the concentration of impurities is under the predetermined value, the gas monitor 21 exhausts the gas to the first exhausting port 21b, therefore, the gas is collected and is consequently supplied to the reticle chamber 15 and the wafer chamber 40 as the replacement gas. Accordingly, when the concentration of impurities in the gas exhausted from the first chamber (2, PL) is low, then the gas is re-used as a replacement gas of the second chamber (15, 40). Thus, the usage efficiency of the specific gas (low absorptive gas) can be improved and wasteful consumption can be suppressed.

In addition, with the exposure apparatus 100 in the embodiment, exposure is performed in a state where the entire optical path of the exposure light EL from the light source 1 to the surface of the wafer W is replaced with the low absorptive gas having low absorption to the exposure light EL. Therefore, the transmittance (or the reflectance) of the energy beam incident on the illumination optical system IOP and the projection optical system PL can be maintained at a high level, and it becomes possible to perform exposure amount control with high precision over a long period of time. Also, since vacuum ultraviolet light is used as the exposure light EL, improvement in resolution of the projection optical system PL is possible. Accordingly, the reticle pattern can be transferred onto the wafer with high precision over a long period of time.

The arrangement of the gas supply system described earlier is an example, and the arrangement of the gas supply system related to the present invention is not limited to this. For example, in the gas supply system 110 in the embodiment above, the gas supplying route (piping 28, 29, 22, 51, 52A, and 52B) with the separating unit 22 as the core can be removed. And the exit side of the collection piping 28 may be connected via the gas purity monitor 21 (or directly) to the entrance of the gas purify unit 23, and the exit of the gas purify unit 23 may be connected to the temperature adjustment unit 24 via piping and the pump 25. With this arrangement, the gas collected in the collection piping 28 all flows into the gas purify unit 23. Therefore, the life of the gas purify unit 23 becomes shorter (as well as the life of the filter and the maintenance frequency of the cryopump increases) compared with the embodiment described above. The purity, however, of the recycled replacement gas supplied to the reticle chamber 15 and the wafer chamber 40 from the temperature adjustment unit 24 becomes higher in this case. As a consequence, the purity (purge accuracy) of the low absorptive gas required in each chamber (2, PL, 15, and 40) can be satisfied with a higher certainty.

Or, for example, the gas purify unit 23 can further be omitted and the exit side of the collection piping 28 can be connected via the gas purity monitor 21 (or without going through the gas purity monitor) to the entrance of the temperature adjustment unit 24 via piping and the pump 25. With this arrangement, the temperature adjustment unit 24 can remove impurities of the gas collected in the collection piping and adjust the temperature to a predetermined temperature as the recycled replacement gas. The gas is then supplied to the reticle chamber 15 and the wafer chamber 40, which does not cause any serious problems. This is because the optical path is short in the reticle chamber 15 and the wafer chamber 40 so the effect of impurities is not so large even if some do exist. Whereas, within the illumination optical system IOP and the projection optical system PL where the optical path of the exposure light EL is long including many optical elements such as lenses, the optical path has to be filled with a specific gas (low absorptive gas) with extremely high purity to remove the impurities in the path.

Furthermore, the temperature adjustment unit 24 may also be removed, and the exit side of the collection piping 28 may be connected via the gas purity monitor 21 (or without going through the gas purity monitor) to the piping 54A via the pump 25. In the case the gas purify unit is not provided, the temperature change of the gas collected with the collection piping 28 is not so large. Since the collected gas is supplied to the reticle chamber and the wafer chamber and the like, it does not cause a serious problem even if the temperature adjustment unit 24 is not provided.

As a matter of course, the gas purity monitor 21 also does not necessarily have to be arranged. In this case, however, when arranging the gas purify unit, it is preferable to arrange the gas supplying route (piping 28, 29, 22, 51, 52A, and 52B) so that not all the collected gas flows into the gas purify unit. It is also preferable to make an arrangement so that the collected gas from the initial gas replacement that contains much oxygen does not flow into the gas purify unit. This is because when a large amount of gas flows through the gas purify unit the life of the unit becomes shorter, so it is preferable to create a partial flow which goes through the gas purify unit to maintain the gas purity. In addition, when gas containing a large amount of impurities flows into the gas purify unit, the life of the gas purify unit similarly becomes shorter. Therefore, on initial gas replacement, it is preferable to exhaust the collected gas from initial gas replacement which contains a large amount of impurities to extend the life of the gas purify unit. Especially in the case of using helium as the low absorptive gas, since the purifying unit for helium (based on the getter method) generates heat when reacting with a large amount of oxygen, the method described above becomes extremely important.

In addition, for example, in the case the apparatus comprises: a first chamber formed in between the light source 1 serving as an energy beam and the wafer W and between the first optical element and second optical element (for example, the sealed chamber when the space in between the adjacent lens elements structuring the projection optical system PL is made into a sealed chamber); and a second chamber which houses at least a part of the movable optical member arranged in between the light source 1 and the wafer (such as the movable reticle blind 13B, the reticle R) and the driving system which drives the optical member (such as the blind driving unit 13C, the reticle stage RST and the reticle driving system 44), a gas supply system may be arranged to supply the low absorptive gas to the first chamber and to collect and supply the gas exhausted from the first chamber to the second chamber. In this case, since the first chamber is formed in between the optical elements arranged along the optical path, the main purpose to purge the interior with the low absorptive gas is to remove as much impurities as possible. Therefore, the low absorptive gas supplied to the first chamber requires a high purity level. On the other hand, the main purpose of purging the second chamber where at least a part of the movable optical member and the driving system are housed with the low absorptive gas is to exhaust outside impurities such as dust (particles) generated from the movable portion. So the specific gas supplied to the second chamber may be a specific gas with a purity level lower than the gas provided to the first chamber. Accordingly, with this arrangement, the purity of the low absorptive gas required in each chamber can be sufficiently satisfied, while maintaining the transmittance of the energy beam (exposure light) in the first chamber. Also, the specific gas that circulates the first chamber is not exhausted outside and is used as the replacement gas of the second chamber. Therefore, the usage efficiency of the specific gas can be improved, thus leading to suppressing wasteful consumption of the specific gas (low absorptive gas).

The Second Embodiment

The second embodiment of the present invention will be described based on FIG. 4. Structures and components identical or equivalent to those described in the first embodiment are designated with the same reference numerals, and the description thereabout is briefly made or is entirely omitted.

The exposure apparatus related to the second embodiment is identical in structure to the exposure apparatus of the first embodiment except for the structure of the gas supply/exhaust system of the low absorptive gas serving as a specific gas. Therefore, the gas supply/exhaust system will be mainly focused in the following description.

Figure 4:
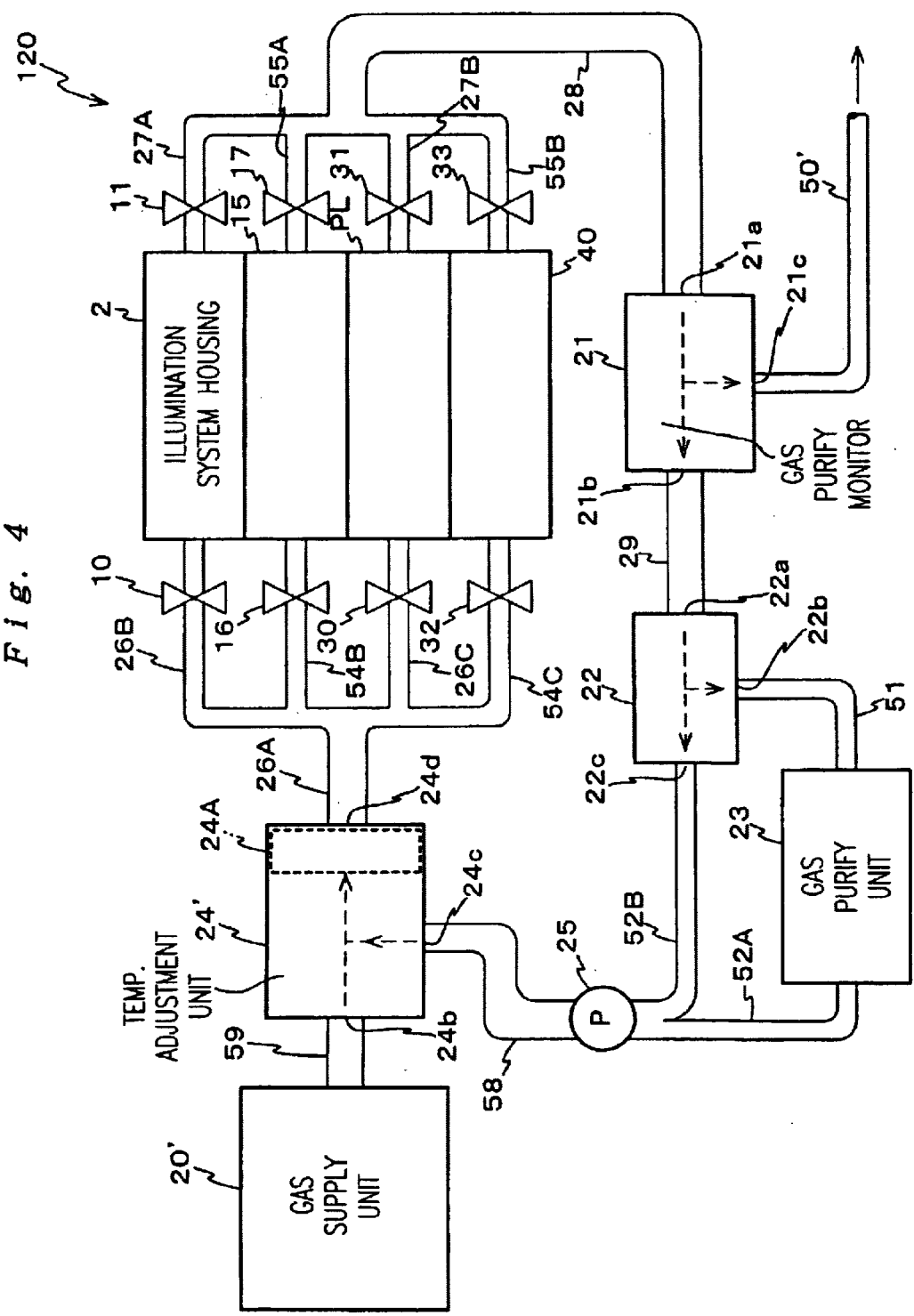
FIG. 4 is a simplified view showing the gas circulation system arrangement of the exposure apparatus related to the second embodiment.

FIG. 4 shows a gas circulation system 120, which is the gas supply/exhaust system of the exposure apparatus related to the second embodiment. The characteristic of the gas circulation system 120 is that it re-supplies and circulates the collected gas. That is, the gas circulation system 120 collects the gas exhausted from the illumination system housing 2, the reticle chamber 15, the barrel (housing) of the projection optical system PL, and the wafer chamber 40. Then, it re-supplies the collected gas to the illumination system housing 2, the reticle chamber 15, the projection optical system PL, and the wafer chamber 40 along with fresh low absorptive gas with high purity supplied from the gas supply unit 20'. In this case, the gas supply unit 20' replenishes only the decreased amount.

The gas circulation system 120 comprises: a temperature adjustment unit 24'; a gas purity monitor 21 serving as a gas purity monitoring unit; a separation unit 22; a gas purify unit 23; a pump 25, and the like.

The first entrance 24b of the temperature adjustment unit 24' is connected to the gas supply unit 20', which is the external supply source of the low absorptive gas via the piping 59. The gas supply unit 20' incorporates a cylinder (or a tank) that contains low absorptive gas with high purity (concentration of impurities under 1 ppm), a pump (not shown in Figs.) and the like.

Other than the first entrance 24b, the temperature adjustment unit 24' has a second entrance 24c and a second exit 24d. The second entrance 24c of the temperature adjustment unit 24' is connected to one end of piping 58. The other end of the piping 58 is connected to the end where the piping 52A and 52B that structure the gas supplying route (piping 28, 29, 22, 51, 52A, and 52B) come together via the pump 25. Within the temperature adjustment unit 24', a flow rate sensor (not shown in Figs.) that detects the flow rate of the gas flowing in from the second entrance 24c is arranged. The output of the flow rate sensor is sent to the main controller 70. And based on the output of the flow rate sensor, the main controller 70 controls the flow rate of the low absorptive gas with high purity (concentration of impurities under 1 ppm) to be supplied from the gas supply unit 20'. In this case, during the gas purity maintenance, which will be described later on, the main controller 70 controls the gas supply unit 20'. By this control, the total of the flow rate of the gas supplied via the piping 58 and the gas supplied (replenished) from the gas supply unit 20' is always maintained at a constant value.

The temperature adjustment unit 24' incorporates a cooler, a heater, a temperature sensor, a controller to control the cooler and the heater so that the gas flowing in from the first and second entrance 24b and 24c is adjusted to a predetermined temperature based on the detection values of the temperature sensor, and the like. Also, a filter unit 24A is arranged in the vicinity of the exit in the temperature adjustment unit 24'. One end of a main gas supply piping 26A is connected to the exit 24d of the temperature adjustment unit 24', and the other end of the main gas supply piping 26A is divided into four branches, 26B, 54B, 26C, and 54C. Likewise with the first embodiment, these branch piping 26B, 54B, 26C, and 54C are respectively connected to one side of the illumination system housing 2, the reticle chamber 15, the projection optical system PL, and the wafer chamber 40. In the vicinity of the connected portion of the branch piping 26B, 54B, 26C, and 54C to the respective chambers, gas supply valves 10, 16, 30, and 32 are respectively arranged, as in the first embodiment.

Likewise with the first embodiment, one end of the exhausting branch piping 27A, 55A, 27B, and 55B is connected to the other side of the illumination system housing 2, the reticle chamber 15, the projection optical system PL, and the wafer chamber 40. And in the vicinity of the connected portion of the exhausting branch piping 27A, 55A, 27B, and 55B, exhausting valves 11, 17, 31, and 33 are respectively arranged. The other end of the exhausting branch piping 27A, 55A, 27B, and 55B come together with one another, and is connected to one end of a collection piping 28. The other end of the collection piping 28 is connected to the gas supply port 21a of the gas purity monitor 21.

One end of an exhausting piping 50' is connected to the second exhausting port 21c of the gas purity monitor 21, and the other end is connected to the storage chamber (not shown in Figs.).

The remaining structure of the gas circulation system 120 is identical to the gas supply system 110 in the first embodiment. In addition, other structures are identical to the exposure apparatus 100 described in the first embodiment.

Next, the supply/exhausting operation of the exposure apparatus in the second embodiment of low absorptive gas to the illumination system housing 2, the reticle chamber 15, the projection optical system PL, and the wafer chamber 40 will be described.

On initial gas replacement such as the start-up of the apparatus, the main controller 70 completely opens the gas supply valves 10, 16, 30, and 32, and the exhausting valves 11, 17, 31, and 33. This is performed based on the instructions from the operator, and the main controller 70 then instructs the gas supply unit 20' to start supplying the gas. With this operation, low absorptive gas with high purity begins to be supplied from the gas supply unit 20' to the temperature adjustment unit 24' via the piping 59. Within the temperature adjustment unit 24', the controller controls the cooler and heater so that the gas flowing into the unit is at a predetermined temperature based on the detection values of the temperature sensor. When the gas which temperature is adjusted passes through the filter unit 24A, chemical impurities such as absorptive gas and particles are removed, and then the gas is supplied to the main gas supply piping 26A. The low absorptive gas supplied to the main gas supply piping 26A begins to be supplied respectively to the illumination system housing 2, the reticle chamber 15, the projection optical system PL, and the wafer chamber 40 via the main gas supply piping 26A and the branch piping 26B, 54B, 26C, and 54C. The initial gas replacement begins in this manner.

In correspondence with the start of supplying low absorptive gas as is described above, the internal gas within the illumination system housing 2 and the projection optical system PL is exhausted into the collection piping 28 via the exhausting branch piping 27A, 55A, 27B, and 57B. The gas exhausted into the collection piping 28 flows into the gas purity monitor 21 via the gas supply port 21a. Within the gas purity monitor 21, the gas sensor detects the concentration of the absorptive gas such as oxygen and ozone, and the controller decides whether the concentration of the absorptive gas exceeds the threshold value set in advance. In this case, since it is immediately after the start of the initial gas replacement, the gas from the collection piping 28 (hereinafter also referred to as "collected gas" for the sake of convenience) contains a large amount of air (oxygen). Therefore, the controller switches the direction valve so that the collected gas is exhausted from the second exhausting port 21c. By this operation, the collected gas is exhausted to the storage chamber (not shown in Figs.) via the exhausting piping 50'. The detection values of the gas sensor in the gas purity monitor 21 are also sent to the main controller 70.

The state described above is maintained until a predetermined period of time has elapsed, and the collected gas from the illumination system housing 2 and the projection optical system PL is exhausted to the storage chamber (not shown in Figs.).

After a predetermined period of time has elapsed from the beginning of initial gas replacement, the internal gas of the illumination system housing 2, the reticle chamber 15, the projection optical system PL, and the wafer chamber 40 is almost totally replaced with the low absorptive gas supplied from the gas supply unit 20'. Immediately after the replacement, the concentration of absorptive gas in the collected gas flowing into the gas purity monitor 21 via the collection piping 28 decreases. When the concentration falls under a predetermined value, the controller of the gas purity monitor 21 decides that the concentration of the absorptive gas is under the threshold value set in advance based on the detection values of the gas sensor, and switches the direction control valve so that the collected gas is exhausted via the first exhausting port 21b. While this is being performed, the main controller 70 acknowledges that the initial gas replacement has been completed based on the detection values of the gas sensor of the gas purity monitor 21, and operates the pump 25. The main controller 70 also adjusts the opening degree of the adjustment valve of the separation unit 22 in accordance with the detection values of the gas sensor, and adjusts the proportion of the collected gas exhausted respectively from the exhausting port 22b and 22c. This adjustment is performed in the same manner as in the first embodiment.

In this case, during the initial gas replacement operation, the controller of the gas purity monitor 21 may judge that the concentration of impurities in the gas has fallen under a predetermined level with the elapse of a predetermined period of time. In a similar manner, the main controller 70 may judge the completion of the initial gas replacement.

In addition, when the main controller 70 decides that the initial gas replacement is completed in the manner described above, it then respectively sets the opening degree of the gas supply valve 10, 16, 30, and 32 and the exhausting valve 11, 17, 31, and 33 to a value corresponding to each target flow rate that is determined in advance. Thus, the state moves into a gas purity maintenance state where the purity of the low absorptive gas within the illumination system housing 2, the reticle chamber 15, the projection optical system PL, and the wafer chamber 40 is respectively maintained at each target value.

In the gas purity maintenance state, the gas collected from the first exhausting port 21b of the gas purity monitor 21 flows into the gas separation unit 22 via the piping 29 and the gas supply port 22a. The gas is separated at the gas separation unit 22, and is respectively exhausted from the first exhausting port 22b and the second exhausting port 22c. The partial collected gas exhausted from the first exhausting port 22b flows into the gas purify unit 23 via the piping 51 where impurities such as absorptive gas are removed while flowing through the unit. The gas that has passed through the gas purify unit 23 becomes low absorptive gas with higher purity and is exhausted into the piping 52A. The low absorptive gas with higher purity merges into the remaining collected gas, which is exhausted into the piping 52B from the second exhausting port 22c, just before flowing into the pump 25. The low absorptive gas which purity has slightly decreased due to the merge flows into the second entrance 24c of the temperature adjustment unit 24' by the pump 25 via the piping 58. The flow rate of the low absorptive gas supplied to the temperature adjustment unit 24' is detected with the flow rate sensor of the temperature adjustment unit 24'. And based on the detection values, the main controller 70 controls the gas supply unit 20' so that the total of the flow rate of the gas supplied via the piping 58 and the gas supplied (replenished) from the gas supply unit 20' is always maintained at a constant value.

In the temperature adjustment unit 24', the controller controls the cooler and heater based on the detection values of the temperature sensor, so that the low absorptive gas flowing in from the two entrances 24b and 24c at a constant flow rate is maintained at a predetermined temperature. When the gas which temperature is adjusted passes through the filter unit 24A, chemical impurities such as absorptive gas, and particles, and the like are removed and becomes the low absorptive gas for replacement. This gas is supplied to the main gas supply piping 26A, and then respectively supplied and circulated to the illumination system housing 2, the reticle chamber 15, the projection optical system PL, and the wafer chamber 40 via the each of the branch piping 26B, 54B, 26C, and 54C.

When this has been completed, the gas purity maintenance state continues and the purity of the low absorptive gas within the illumination system housing 2, the reticle chamber 15, the projection optical system PL, and the wafer chamber 40, is maintained at the respective target values. Thus, the concentration of impurities such as absorptive gas in the low absorptive gas inside these chambers is maintained to be less than 1 ppm.

During the gas purity maintenance state (when the gas purity is maintained) described above, the main controller 70 monitors the detection values of the gas sensor in the gas purity monitor 21 at all times. And in correspondence with the detection values, the main controller 70 adjusts the adjustment valve of the separation unit 22 at all times following the criteria referred to earlier. Thus, the purity of the low absorptive gas within the illumination system housing 2, the reticle chamber 15, the projection optical system PL, and the wafer chamber 40 is maintained at a predetermined range. In addition, the gas monitor 21 monitors the gas purity of the collected gas at all times even in the gas purity maintenance state. And when the gas monitor 21 detects that the concentration of impurities such as absorptive gas has exceeded a predetermined value, it exhausts the collected gas from the second exhausting port 21c.

As is described, with the exposure apparatus related to the second embodiment, the gas circulation system 120 supplies to the closed space located on the optical path between the light source 1 and the wafer W, low absorptive gas with high purity that has a characteristic feature of transmitting the exposure light (energy beam) EL, while maintaining the purity within a predetermined range as well as replenishing the gas shortage from the exterior. To be more concrete, the closed space where the gas circulation system 120 supplies the low absorptive gas are the illumination system housing 2, the reticle chamber 15, the projection optical system PL, and the wafer chamber 40. And in correspondence with the low absorptive gas supply, the gas circulation system 120 collects the gas exhausted from the illumination system housing 2, the reticle chamber 15, the projection optical system PL, and the wafer chamber 40, and then re-supplies the collected gas to the illumination system housing 2, the reticle chamber 15, the projection optical system PL, and the wafer chamber 40 through a predetermined route along with the low absorptive gas replenished from the gas supply unit 20'.

Most of the low absorptive gas, therefore, is re-used in the illumination system housing 2, the reticle chamber 15, the projection optical system PL, and the wafer chamber 40, so the usage efficiency of the low absorptive gas can be improved and wasteful consumption can be suppressed. In this case, the low absorptive gas supplied to the illumination system housing 2, the reticle chamber 15, the projection optical system PL, and the wafer chamber 40 is not positively exhausted outside, with the exception of when the gas contains an extremely high amount of impurities such as absorptive gas. Accordingly, compared with the first embodiment described earlier, the usage efficiency of the low absorptive gas can be further improved as well as the amount of consumption reduced.

In addition, the gas circulation system 120 maintains the purity of the low absorptive gas supplied to the illumination system housing 2, the reticle chamber 15, the projection optical system PL, and the wafer chamber 40 at a predetermined range. Therefore, reduction in transmittance of the exposure light within the illumination system housing 2, the reticle chamber 15, the projection optical system PL, and the wafer chamber 40 can be prevented.

Also, the gas circulation system 120 comprises the temperature adjustment unit 24' that adjusts the temperature of the gas having passed through the filter unit 24A to a predetermined level and supplies the gas to the illumination system housing 2, the reticle chamber 15, the projection optical system PL, and the wafer chamber 40. The temperature adjustment unit 24' has the gas purify unit 23 that purifies at least a part of the gas collected from the illumination system housing 2, the reticle chamber 15, the projection optical system PL, and the wafer chamber 40 and increases the purity of the low absorptive gas in the collected gas. It also has the filter unit 24A (which includes the chemical filter) that removes the impurities in the gas supplied, the gas supplied being the merged gas of the gas which has passed through the gas purify unit 23, the collected gas which has not flown through the gas purifying 23, and the low absorptive gas with high purity replenished from the gas supply unit 20'. Therefore, the low absorptive gas with high purity which impurities have been removed and temperature adjusted is supplied and circulated to the illumination system housing 2, the reticle chamber 15, the projection optical system PL, and the wafer chamber 40. As a consequence, reduction of transmittance to the energy beam (exposure light) in the illumination system housing 2, the reticle chamber 15, the projection optical system PL, and the wafer chamber 40 can be effectively suppressed.

Also, in this case, since the temperature adjustment unit 24' is used in common to adjust both the temperatures of the fresh low absorptive gas from the gas supply unit 20' and the collected gas, the gas supply unit side does not require a temperature adjustment unit.

In addition, in the second embodiment, the gas circulation system 120 comprises the gas purity monitor 21 that monitors the concentration of impurities in the gas collected from the illumination system housing 2, the reticle chamber 15, the projection optical system PL, and the wafer chamber 40, and exhausts the gas outside when the concentration of impurities exceed a predetermined value. Therefore, since the gas purity monitor 21 monitors the concentration of impurities in the gas collected from the illumination system housing 2, the reticle chamber 15, the projection optical system PL, and the wafer chamber 40, and exhausts the gas outside when the concentration of impurities exceed a predetermined value, the concentration of impurities of the gas supplied to the gas purify unit 23 does not exceed a certain level. Thus, the gas purify unit 23 life (the life of the filter or the maintenance frequency of the cryopump) can be extended.

Also, in the second embodiment, the gas circulation system 120 exhausts the collected gas during the initial gas replacement operation of replacing the gas within the illumination system housing 2, the reticle chamber 15, the projection optical system PL, and the wafer chamber 40 (gas which contains a large amount of absorptive gas such as oxygen) to the low absorptive gas, until the concentration of impurities in the gas exhausted from each chamber does not exceed a predetermined level. Therefore, since the gas circulation system 120 exhausts the gas outside when the concentration of impurities (such as absorptive gas) in the gas exhausted from these closed spaces is high, the purity of the low absorptive gas supplied to the illumination system housing 2, the reticle chamber 15, the projection optical system PL, and the wafer chamber 40 does not decrease to the extreme. Thus, reduction in transmittance to the energy beam (exposure light) in these closed spaces can be suppressed.

In addition, with the exposure apparatus in the second embodiment, exposure is performed with the entire optical path of the exposure light EL, from the light source 1 to the surface of the wafer W, replaced with the low absorptive gas which absorption is low to the exposure light EL. Therefore, the transmittance (or the reflectance) of the exposure light EL incident on the illumination optical system IOP and the projection optical system PL can be maintained at a high level, and it becomes possible to perform exposure control with high precision over a long period of time. And, since vacuum ultraviolet light is used as the exposure light EL, it is possible to improve the resolution of the projection optical system PL. Accordingly, it becomes possible to transfer the reticle pattern on the wafer with high precision over a long period of time.

The structure of the gas circulation system 120 in the second embodiment is a mere example, and it is a matter of course that the structure of the gas circulation system related to the present invention is not limited to this. For example, with the gas circulation system 120 in the embodiment above, the gas supplying route (piping 28, 29, 22, 51, 52A, and 52B) may be removed, and the exit side of the collection piping 28 maybe connected via the gas purity monitor 21 (or directly) to the entrance of the gas purify unit 23. Furthermore, the exit of the gas purify unit 23 may be connected to the temperature adjustment unit 24' via piping and the pump 25. With this arrangement, the entire gas collected in the collection piping 28, flows into the gas purify unit 23. Therefore, the life of the gas purify unit 23 becomes shorter compared with the embodiment described above. The purity of the recycled replacement gas supplied to the reticle chamber 15 and the wafer chamber 40 from the temperature adjustment unit 24', however, becomes higher in this case. As a consequence, the purity (purge accuracy) of the low absorptive gas required in each chamber (2, PL, 15, and 40) can be satisfied with a higher certainty.

In addition, for example, if the performance of the filter unit 24A of the temperature adjustment unit 24' is extremely high, the gas purify unit 23 can further be omitted. In this case, the exit side of the collection piping 28 can be connected via the gas purity monitor 21 (or without going through the gas purity monitor) to the temperature adjustment unit 24' the pump 25.

Naturally, likewise with the first embodiment, the gas purity monitor 21 does not necessarily have to be arranged. In this case, however, when arranging the gas purify unit, it is preferable to arrange the gas supplying routes (28, 29, 22, 51, 52A, and 52B) described earlier so that not all the collected gas flows into the gas purify unit. It is also preferable to make an arrangement so that the collected gas from the initial gas replacement that contains much oxygen does not flow into the gas purify unit. The reasons are the same as in the first embodiment.

As is obvious from the explanation so far, with the second embodiment, the case has been described when the illumination system housing 2, the reticle chamber 15, the projection optical system PL, and the wafer chamber 40 each structure the closed space located on the optical path of the energy beam (exposure light) EL between the light source 1 serving as an energy beam and the wafer W. And the gas circulation system 120 supplies the low absorptive gas, which has properties of transmitting the energy beam to the closed space, while maintaining the purity within a predetermined range and replenishing the shortage from the outside, and collects the gas exhausted from the closed space and re-supplies the collected gas. That is, the description is of the case when the first chamber and the second chamber are the same closed space. However, the present invention is not limited to this. For example, similar with the first embodiment, the first chamber may be structured of the illumination system housing 2 and the projection optical system PL, and the second chamber by the reticle chamber 15 and the wafer chamber 40. And the gas circulation system may supply the low absorptive gas which purity is maintained within a predetermined range and the shortage being replenished from the outside to the first chamber, as well as collect the gas exhausted from the first chamber and supply it to the second chamber.

In addition, the first and second chamber is not limited to the chambers such as the illumination system housing 2, the reticle chamber 15, the projection optical system PL, and the wafer chamber 40. For example, of the first chamber and the second chamber, at least the first chamber may be arranged in the space in between the optical elements (such as the lens and the mirror) on the optical path of the energy beam. Such closed space can be arranged, for example, in the interior of the illumination optical system or the projection optical system.

Also, in the first embodiment above, the case is described when the first chamber and second chamber are sealed chambers, in a sealed state to the outside. In addition, the second embodiment, the case has been described when the closed space is a sealed chamber. These arrangements are made from the aspect of suppressing impurities from the outside concentrating in each room or closed space as much as possible, so the first chamber and the second chamber, and the closed space do not necessarily have to be sealed chambers.

In each embodiment described above, the case has been described when the low absorptive gas flows into the illumination system housing 2, the reticle chamber 15, the projection optical system PL, and the wafer chamber 40. However, the present invention is not limited to this, and at least in one of these chambers the gas supply valve and the exhausting valve may be closed after the first initial gas replacement, and the interior of the chamber may be maintained at a predetermined target pressure. In this case, the main controller 70 may decide the opening/closing timing of the gas supply valve and the exhausting valve and the operation timing of the pump, based on the output of the gas sensor.

As for the predetermined target pressure, it is preferable for it to be 1 to 10% higher against the atmospheric pressure. This is because from the viewpoint of preventing the air outside from concentrating (leakage) into the illumination system housing 2, the reticle chamber 15, the projection optical system PL, and the wafer chamber 40, it is preferable to set the internal pressure higher than the atmospheric pressure. If the internal pressure is set too high, however, the housings need to be built stronger to support the difference in pressure, which leads to the weight being heavier.

In each embodiment above, the pulse laser light source in the vacuum ultraviolet region such as the $F_2$ laser, the $Ar_2$ laser, or the ArF excimer laser has been used as the light source. The present invention, however, is not limited to this, and it is possible to use the KrF excimer laser light source. Also, for example, other than the laser beams emitted from each light source as vacuum ultraviolet light, a harmonic, which is obtained by amplifying a single-wavelength laser beam in the infrared or visible range being emitted by a DFB semiconductor laser or fiber laser with a fiber amplifier doped with erbium (Er) (or both erbium and ytteribium (Yb)) and converting the wavelength into ultraviolet light using a nonlinear optical crystal, may be used.

If, for example, the oscillation wavelength of a single-wavelength laser is set within the range of 1.51 to 1.59 $\mu$m, an eighth-harmonics whose generation wavelength falls within the range of 189 to 199 nm or a tenth-harmonics whose generation wavelength falls within the range of 151 to 159 nm is output. If the oscillation wavelength is set in the range of 1.544 to 1.553 $\mu$m, in particular, an eighth-harmonics whose generation wavelength falls within the range of 193 to 194 nm, that is, ultraviolet light having almost the same wavelength as that of an ArF excimer laser beam, can be obtained. If the oscillation wavelength is set within the range of 1.57 to 1.58 $\mu$m, a tenth-harmonics whose generation wavelength falls within the range of 157 to 158 nm, that is, ultraviolet light having almost the same wavelength as that of an $F_2$ laser beam, can be obtained.

If the oscillation wavelength is set within the range of 1.03 to 1.12 $\mu$m, a seventh-harmonics whose generation wavelength falls within the range of 147 to 160 nm is output. If the oscillation wavelength is set within the range of 1.099 to 1.106 $\mu$m, in particular, a seventh-harmonics whose generation wavelength falls within the range of 157 to 158 $\mu$m, that is, ultraviolet light having almost the same wavelength as that of an $F_2$ laser beam, can be obtained. In this case, as a single-wavelength oscillation laser, for example, an ytteribium-doped fiber laser can be used.

As the projection optical system PL, in the case of using the ArF excimer laser light source or the KrF excimer laser light source as the light source, a refraction system made up of only refraction optical elements (lens elements) is mainly used. In the case of using the $F_2$ laser or the $Ar_2$ laser as the light source, the so-called catadioptric system (a reflection/refraction system) being a combination of both reflection optical elements and refraction optical elements (such as a concave mirror and a beam splitter), which details are disclosed in, for example, Japanese Patent Laid Open No. 03-282527 and the corresponding U.S. Pat. No. 5,220,454, or a reflection optical system made up of only reflection optical elements, are mainly used. In the case of using the $F_2$ laser light source, however, it is possible to use the refraction system. Further, the disclosures cited above are fully incorporated herein by reference.

In addition, the material (glass material) of the lenses structuring the projection optical system need to differ depending on the light source used. In the case of using the ArF excimer light source or a KrF excimer light source, both synthetic quartz and fluorite may be used. But in the case of using vacuum ultraviolet light source such as the $F_2$ laser as the light source, all the lenses need to be made of fluorite. However, in the case of using material other than fluorite, fluoride single crystal such as lithium fluoride, magnesium fluoride, and strontium fluoride, or a conjugate fluoride crystal of lithium-calcium-aluminum (Li—Ca—Al) or a conjugate fluoride crystal of lithium-strontium-aluminum (Li—Sr—Al) may be used. Or, fluoride glass made of zirconium-barium-lanthanum-aluminum (Zr—Ba—La—Al), or improved quartz such as quartz glass doped with fluorine, quartz glass doped with both fluorine and hydrogen, quartz glass containing the OH group, or quartz glass containing fluorine and the OH group may be used.

In each embodiment above, the case is described when the present invention is applied to the scanning exposure apparatus based on the step-and-scan method, however, as a matter of course, the application of the present invention is not limited to this. That is, the present invention can also be suitably applied to the reduction projection exposure apparatus based on the step-and-repeat method.

In addition, as the levitation method, the wafer stage WST and the reticle scanning stage 14A may employ a levitation method utilizing the gas flow instead of magnetic levitation. In such a case, the gas supplied for levitation is preferably the low absorptive gas referred to earlier in the description.

The exposure apparatus 100 in the embodiments above related to the present invention can be made by incorporating the illumination optical system made up of a plurality of lenses and the projection optical system into the main body of the exposure apparatus and performing optical adjustment, while incorporating the wafer stage (and the reticle stage in the case of the scanning exposure apparatus) that are made up of various mechanical components into the main body of the exposure apparatus, connecting the wiring and piping, assembling the separating walls, connecting the gas piping system, connecting each portion to the control system such as the main controller 70, and furthermore, performing total adjustment (electrical adjustment, operational adjustment). The exposure apparatus is preferably made in a clean room in which temperature, degree of cleanliness, and the like are controlled.

Device Manufacturing Method

A device manufacturing method using the exposure apparatus and the exposure method described above in a lithographic process will be described next.

Figure 5:
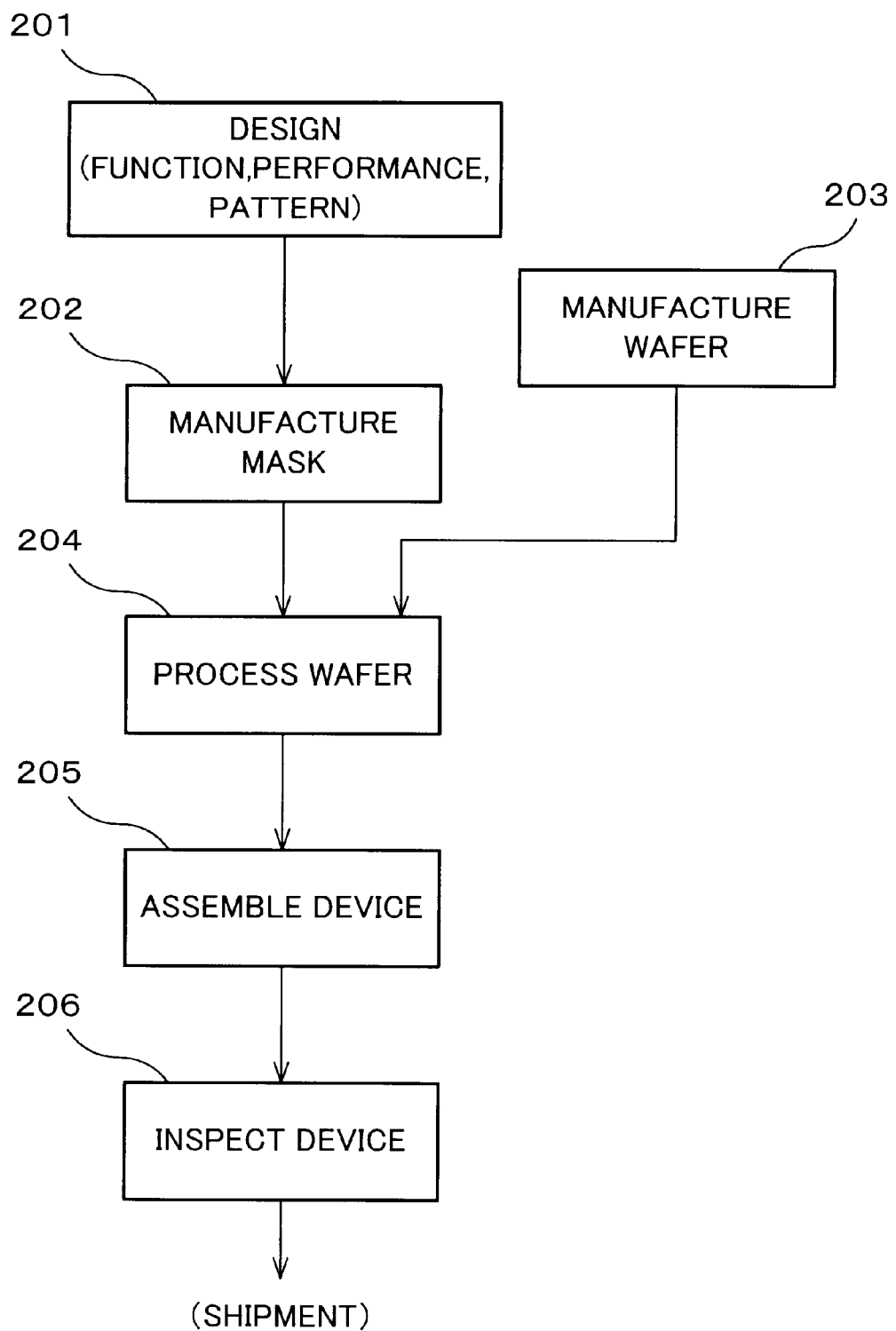
FIG. 5 is a flow chart for explaining an embodiment of a device manufacturing method according to the present invention.

FIG. 5 is a flowchart showing an example of manufacturing a device (a semiconductor chip such as an IC or LSI, a liquid crystal panel, a CCD, a thin magnetic head, a micromachine, or the like). As shown in FIG. 5, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. Instep 203 (wafer manufacturing step), a wafer is manufacturing by using a silicon material or the like.

In step 204 (wafer processing step), an actual circuit and the like is formed on the wafer by lithography or the like using the mask and wafer prepared in steps 201 to 203, as will be described later. In step 205 (device assembly step), a device is assembled using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 6:
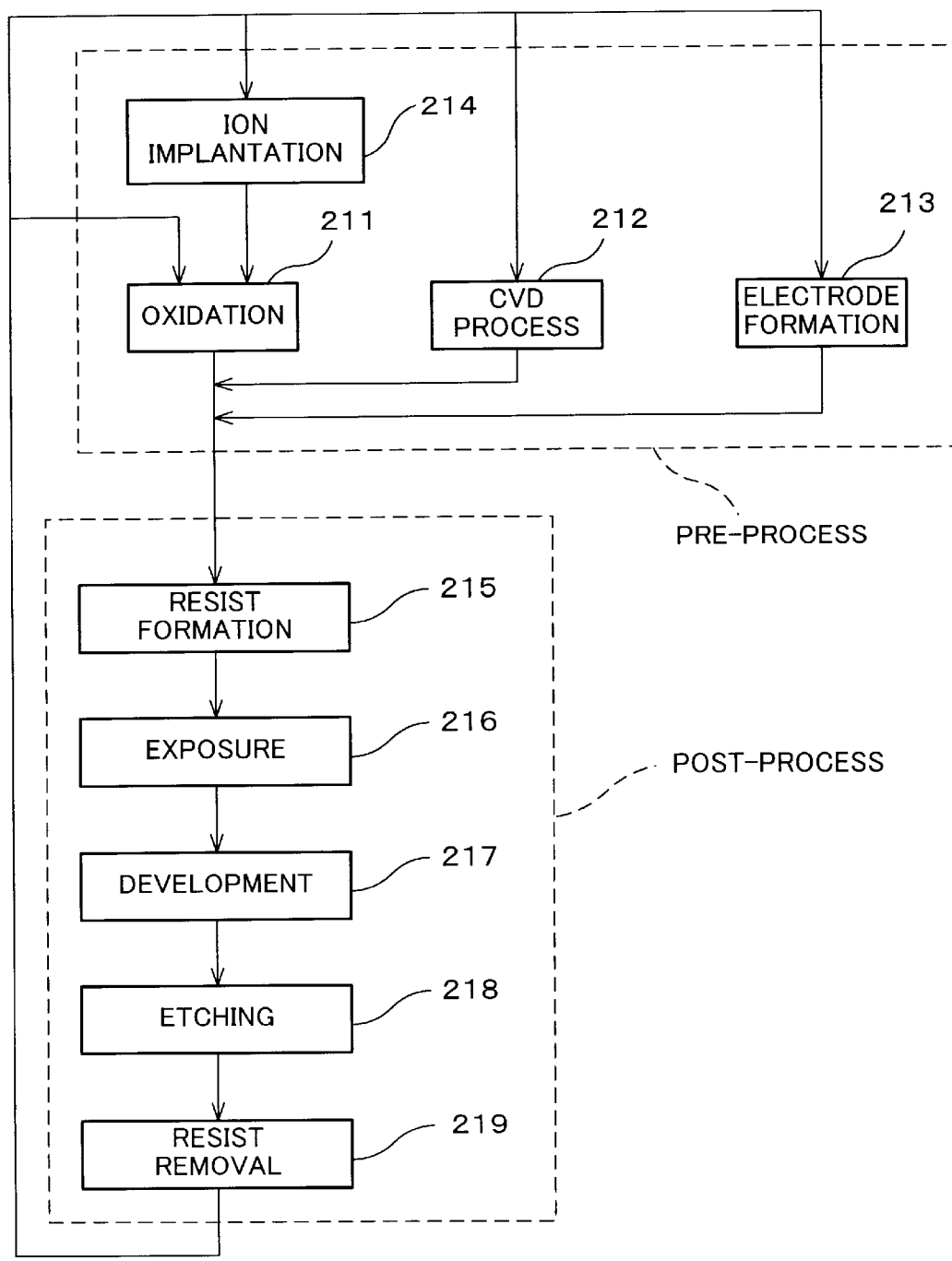
FIG. 6 is a flow chart showing the processing in step 204 in FIG. 5.

FIG. 6 is a flow chart showing a detailed example of step 204 described above in manufacturing the semiconductor device. Referring to FIG. 6, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transcribed onto the wafer by the above exposure apparatus and method. Then, in step 217 (developing step), the exposed wafer is developed. In step 218 (etching step), an exposed member on a portion other than a portion where the resist is left is removed by etching. Finally, in step 219 (resist removing step), the unnecessary resist after the etching is removed.

By repeatedly performing these pre-process and post-process steps, multiple circuit patterns are formed on the wafer.

As described above, according to the device manufacturing method of the embodiment, the exposure apparatus described in each embodiment above is used in the exposure process (step 216). Therefore, exposure amount control can be performed with high accuracy over a long period of time while maintaining the transmittance of the exposure light, the pattern formed on the reticle can be accurately transferred onto the wafer. In addition, the amount of helium gas and the like consumed can be suppressed, which leads to reducing the running cost of the apparatus. Accordingly, the productivity of the device can be improved without reducing the yield of the device.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that illuminates a mask with an energy beam from an energy beam source and transfers a pattern formed on said mask onto a substrate, said exposure apparatus comprising:

a first chamber which is located on an optical path of said energy beam between said energy beam source and said substrate; and a gas supply system which is connected to said first chamber and supplies a specific gas with a characteristic feature of having transmittance relative to said exposure beam to said first chamber, and supplies gas exhausted from said first chamber to a second chamber which is different from said first chamber and is located on said optical path.

2. The exposure apparatus according to claim 1, said exposure apparatus further comprising:

an optical member which is located between said energy beam source and said substrate; and a driving system which is connected to said optical member and drives said optical member, wherein said first chamber is a closed space formed in between a first optical element and a second optical element that are arranged in between said energy beam source and said substrate, and said second chamber is a closed space which houses at least a part of said optical member and said driving system.

3. The exposure apparatus according to claim 1, said exposure apparatus further comprising:

an illumination optical system which is located in between said energy beam source and said mask and illuminates said mask with said energy beam from said energy beam source; and a projection optical system which is located in between said mask and said substrate and projects said energy beam via said mask on said substrate, wherein a housing which houses said illumination optical system, a mask chamber which houses a mask stage holding said mask, a barrel which houses said projection optical system, and a substrate chamber which houses a substrate stage holding said substrate are arranged as said closed space, and said first chamber is at least one of said housing which houses said illumination optical system and sais barrel which houses said projection optical system, and said second chamber is at least one of said mask chamber and said substrate chamber.

4. The exposure apparatus according to claim 1, wherein said gas supply system further comprises a gas purity monitoring unit which monitors concentration of impurities in said gas exhausted from said first chamber and exhausts said gas outside when said concentration of said impurities exceeds a predetermined value.

5. The exposure apparatus according to claim 4, wherein said gas supply system further comprises a gas purify unit that purifies said gas exhausted from said first chamber and improves purity of said specific gas in said gas exhausted.

6. The exposure apparatus according to claim 5, wherein said gas supply system further comprises a gas supply route which separates said gas exhausted from said first chamber and partially supplies said gas to said gas purify unit and merges said gas having passed through said gas purify unit into remaining of said gas exhausted from said first chamber.

7. The exposure apparatus according to claim 6, wherein said gas supply system further comprises a temperature adjustment unit that has a chemical filter which removes impurities in said merged gas having passed through said gas supply route, and adjusts said gas to a predetermined temperature.

8. The exposure apparatus according to claim 5, wherein said gas supply system further comprises a temperature adjustment unit that has a chemical filter which removes impurities in said gas having passed through said gas purify unit, and adjusts said gas to a predetermined temperature.

9. The exposure apparatus according to claim 1, wherein said gas supply system further comprises a gas purify unit which purifies and increases purity of said specific gas in said gas exhausted from said first chamber.

10. The exposure apparatus according to claim 9, wherein said gas supply system further comprises a gas supply route which separates said gas exhausted from said first chamber and partially supplies said gas to said gas purify unit and merges said gas partially supplied to said gas purify unit into remaining of said gas exhausted from said first chamber.

11. The exposure apparatus according to claim 10, wherein said gas supply system further comprises a temperature adjustment unit that has a chemical filter which removes impurities in said merged gas having passed through said gas supply route, and adjusts said gas to a predetermined temperature.

12. The exposure apparatus according to claim 1, wherein said gas supply system further comprises a temperature adjustment unit that has a chemical filter which removes impurities in said gas exhausted from said first chamber, and adjusts said gas supplied to a predetermined temperature.

13. The exposure apparatus according to claim 1, wherein said first chamber and said second chamber are sealed chambers in a state sealed externally.

14. The exposure apparatus according to claim 1, wherein said gas supply system is a gas circulation system which supplies said specific gas to said first chamber while maintaining purity of said specific gas within a predetermined range and replenishing shortage from exterior, collects said gas exhausted from said first chamber, and supplies said gas to said second chamber.

15. The exposure apparatus according to claim 14, said exposure apparatus further comprising:

an illumination optical system which is arranged in between said energy beam source and said mask and illuminates said mask with said energy beam from said energy beam source; and a projection optical system which is arranged in between said mask and said substrate and projects said energy beam via said mask on said substrate, wherein a housing which houses said illumination optical system, a mask chamber which houses a mask stage holding said mask, a barrel which houses said projection optical system, and a substrate chamber which houses a substrate stage holding said substrate are arranged as said closed space, and said first chamber and said second chamber are formed of one of said mask chamber, said substrate chamber, said housing which houses said illumination optical system, and said barrel which houses said projection optical system.

16. The exposure apparatus according to claim 14, wherein said gas circulation system comprises a gas circulation unit which supplies said specific gas to said first chamber, while replenishing shortage from exterior and maintaining purity of said specific gas in accordance with an amount of returned gas exhausted from said second chamber.

17. The exposure apparatus according to claim 14, wherein said gas circulation system exhausts outside said gas exhausted from said first chamber without collecting said gas until concentration of impurities falls under a predetermined level, when initial gas replacement operation is performed to replace gas within said first chamber to said specific gas.

18. The exposure apparatus according to claim 17, wherein said gas circulation system includes a judgement unit which judges that said concentration of impurities in said gas has fallen under a predetermined level by an elapse of a predetermined period of time after starting said initial gas replacement operation, when said initial gas replacement operation is performed.

19. The exposure apparatus according to claim 17, wherein said gas circulation system includes a judgement unit which has a concentration detection unit to detect concentration of at least one of impurities and specific gas in said gas and judges that said concentration of impurities in said gas has fallen under a predetermined level based on an output of said concentration detection unit when said initial gas replacement operation is performed.

20. The exposure apparatus according to claim 14, wherein said gas circulation system further comprises a gas purity monitoring unit which monitors concentration of impurities in said gas exhausted from said first chamber and exhausts said gas outside when said concentration of said impurities exceeds a predetermined value.

21. The exposure apparatus according to claim 20, wherein said gas circulation system further comprises a gas purify unit that purifies said gas collected from said first chamber and improves purity of said specific gas in said gas collected.

22. The exposure apparatus according to claim 21, wherein said gas circulation system further comprises a temperature adjustment unit that has a chemical filter which removes impurities in said gas having passed through said gas purify unit, and adjusts said gas to a predetermined temperature.

23. The exposure apparatus according to claim 21, wherein said gas circulation system further comprises a gas supply route which separates said gas collected from said first chamber and partially supplies said gas to said gas purify unit and merges said gas partially supplied to said gas purify unit into remaining of said gas collected from said first chamber.

24. The exposure apparatus according to claim 23, wherein said gas circulation system further comprises a temperature adjustment unit that has a chemical filter which removes impurities in said merged gas having passed through said gas supply route, and adjusts said gas to a predetermined temperature.

25. The exposure apparatus according to claim 14, wherein said gas circulation system further comprises a gas purify unit that purifies said gas collected from said first chamber and improves purity of said specific gas in said gas collected.

26. The exposure apparatus according to claim 25, wherein said gas circulation system further comprises a gas supply route which separates said gas collected from said first chamber and partially supplies said gas to said gas purify unit and merges said gas partially supplied to said gas purify unit into remaining of said gas collected from said first chamber.

27. The exposure apparatus according to claim 26, wherein said gas circulation system further comprises a temperature adjustment unit that has a chemical filter which removes impurities in said merged gas having passed through said gas supply route, and adjusts said gas to a predetermined temperature.

28. The exposure apparatus according to claim 14, wherein said gas circulation system further comprises a temperature adjustment unit that has a chemical filter which removes impurities in said gas collected from said first chamber, and adjusts said gas supplied to a predetermined temperature.

29. The exposure apparatus according to claim 14, wherein said first chamber and said second chamber are sealed chambers in a state sealed externally.

30. A device manufacturing method including a lithographic process, wherein exposure is performed using said exposure apparatus according to claim 1 in said lithographic process.

31. An exposure method to illuminate a mask with an energy beam from an energy beam source and transfer a pattern formed on said mask onto a substrate, said exposure method comprising:

supplying a specific gas with a characteristic feature of having transmittance relative to said exposure beam to a first chamber located on an optical path of said energy beam between said energy beam source and said substrate, exhausting internal gas from said first chamber, and supplying gas exhausted from said first chamber to a second chamber which is different from said first chamber and is located on said optical path.

32. The exposure method according to claim 31, wherein said first chamber is a closed space formed in between a first optical element and a second optical element arranged in between said energy beam source and said substrate, and said second chamber is a closed space which houses at least a part of an optical member arranged between said energy beam source and said substrate and a driving system which drives said optical member.

33. The exposure method according to claim 31 wherein said first chamber is a housing which houses at least one of an illumination optical system which illuminates said mask with said energy beam from said energy beam source and a projection optical system which projects said energy beam via said mask onto said substrate, and said second chamber is at least one of a mask chamber which houses a mask stage holding said mask and a substrate chamber which houses a substrate stage holding said substrate.

34. The exposure method according to claim 31, wherein impurities concentration of said gas exhausted from said first chamber is monitored, and said gas exhausted from said first chamber is exhausted outside when said impurities concentration exceeds a predetermined value.

35. The exposure method according to claim 31, wherein said gas exhausted from said first chamber is purified and purity of said specific gas in said gas exhausted from said first chamber is increased.

36. The exposure method according to claim 31, wherein said specific gas is supplied to said first chamber while maintaining purity of said specific gas within a predetermined range and replenishing shortage externally, and said gas exhausted from said first chamber is collected and supplied to said second chamber.

* * * * *